United States Patent
Gudino

(10) Patent No.: US 12,399,243 B2
(45) Date of Patent: Aug. 26, 2025

(54) ADAPTABLE DUAL-TUNED OPTICALLY CONTROLLED ON-COIL AMPLIFER FOR HIGH-FIELD MAGNETIC RESONANCE IMAGING SYSTEMS

(71) Applicant: The United States of America, as represented by the Secretary, Department of Health and Human Services, Bethesda, MD (US)

(72) Inventor: Natalia Gudino, Bethesda, MD (US)

(73) Assignee: The United States of America, as represented by the Secretary, Department of Health and Human Services, Bethesda, MD (US)

( * ) Notice: Subject to any disclaimer, the term of this patent is extended or adjusted under 35 U.S.C. 154(b) by 222 days.

(21) Appl. No.: 18/013,042

(22) PCT Filed: Jul. 1, 2021

(86) PCT No.: PCT/US2021/040117
§ 371 (c)(1),
(2) Date: Dec. 27, 2022

(87) PCT Pub. No.: WO2022/006415
PCT Pub. Date: Jan. 6, 2022

(65) Prior Publication Data
US 2023/0243905 A1 Aug. 3, 2023

Related U.S. Application Data

(60) Provisional application No. 63/185,219, filed on May 6, 2021, provisional application No. 63/046,896, filed on Jul. 1, 2020.

(51) Int. Cl.
*G01R 33/36* (2006.01)

(52) U.S. Cl.
CPC ..... *G01R 33/3614* (2013.01); *G01R 33/3607* (2013.01); *G01R 33/3635* (2013.01)

(58) Field of Classification Search
CPC ............ G01R 33/3614; G01R 33/3635; G01R 33/3607
See application file for complete search history.

(56) References Cited

U.S. PATENT DOCUMENTS

| 7,671,595 | B2 | 3/2010 | Griswold et al. |
| 9,747,789 | B2 | 8/2017 | Griswold et al. |

(Continued)

FOREIGN PATENT DOCUMENTS

JP 2011-083413 A 4/2011

OTHER PUBLICATIONS

Brown et al., "A Nested Phosphorus and Proton Coil Array for Brain Magnetic Resonance Imaging and Spectroscopy," *Neuroimage.*, 124 (0 0), 602-611 (2016).

(Continued)

*Primary Examiner* — Gregory H Curran
(74) *Attorney, Agent, or Firm* — Leydig, Voit & Mayer, Ltd.

(57) ABSTRACT

An optically controlled, multi-transmitter magnetic resonance imaging system for multi-nuclear, high field applications is disclosed. In one embodiment, the MRI system may include a dual-tuned radio-frequency (RF), on-coil power amplifier for amplifying RF power signals at two or more frequencies for the multi-nuclear excitations for use in a dual-tuned coil MRI device or a nested coil MRI device. In one particular implementation, the dual-tuned amplifier of the MRI system may receive optical carrier signals through the broadband optical interface to control the on-coil amplifiers. A variable effective inductor circuit for use in tuning the dual-tuned amplifier is also disclosed. The variable (Continued)

effective inductor circuit includes a gallium nitride (eGaN) field effect transistor (FET) device connected to an inductor. The inductance of the variable effective inductor circuit can be adjusted by modulating a drain-source voltage of the eGaN FET device controlled based on a pulse duration of an optical carrier signal.

20 Claims, 18 Drawing Sheets

(56) References Cited

U.S. PATENT DOCUMENTS

| | | | |
|---|---|---|---|
| 9,989,604 B2 | 6/2018 | Griswold et al. | |
| 10,393,831 B2 | 8/2019 | Murphy-Boesch et al. | |
| 2008/0231282 A1 | 9/2008 | Griswold et al. | |
| 2009/0134876 A1 | 5/2009 | Griswold et al. | |
| 2009/0278537 A1* | 11/2009 | Harvey | G01R 33/3657 324/309 |
| 2018/0252783 A1* | 9/2018 | Jones | G01R 33/3635 |

OTHER PUBLICATIONS

Gudino et al., "On-Coil Multiple Channel Transmit System Based on Class-D Amplification and Pre-Amplification with Current Amplitude Feedback," *Magn. Reson. Med.*, 70, 276-289 (2013).

Gudino et al., "Optically Controlled Switch-Mode Current-Source Amplifiers for On-Coil Implementation in High-Field Parallel Transmission," *Magn. Reson. Med.*, 76, 340-349 (2016).

Gudino et al., Optically Controlled On-Coil Amplifier with RF Monitoring Feedback, *Magn. Reson. Med.*, 79 (5) 2833-2841 (2018).

Gudino, ISMRM & SMRT Virtual Conference: The International Society for Magnetic Resonance in Medicine is accredited by the Accreditation Council for Continuing Medical Education to provide continuing medical education for physicians, Scientific Sessions: RF Technologies, Session No. O-80, Aug. 8- 14, 2020 (Abstracts).

European Patent Office, International Search Report and Written Opinion of the International Searching Authority, Application No. PCT/US2021/040117, dated Oct. 18, 2021, 18 pages.

* cited by examiner

ADAPTABLE DUAL-TUNED OPTICALLY CONTROLLED ON-COIL AMPLIFER FOR HIGH-FIELD MAGNETIC RESONANCE IMAGING SYSTEMS

CROSS REFERENCE TO RELATED APPLICATIONS

This application is a U.S. National Phase of International Application No. PCT/US2021/040117, filed on Jul. 1, 2021, which claims priority to U.S. Provisional Patent Application No. 63/046,896, filed on Jul. 1, 2020, and U.S. Provisional Patent Application No. 63/185,219, filed on May 6, 2021, each of which are incorporated herein by reference in their entireties.

STATEMENT REGARDING FEDERALLY SPONSORED RESEARCH OR DEVELOPMENT

This invention was made with United States Government support by the National Institutes of Health, National Institute of Neurological Disorders and Stroke. The United States Government has certain rights in the invention.

FIELD OF THE DISCLOSURE

Embodiments of the present disclosure generally relate to systems and methods for improving magnetic resonance imaging systems, and more specifically for dual-tuning and amplifying signals of high-field magnetic resonance imaging systems.

BACKGROUND

Magnetic resonance imaging (MRI) involves the transmission of radio frequency (RF) energy from a transmission coil, resulting in magnetic resonance (MR) signals which may be received by a receive coil. In some MRI systems, RF energy may have been transmitted from a single coil and resulting MR signals received by a single coil while others may include multiple receivers used in parallel acquisition techniques. Using multiple transmitters provides for parallel transmission techniques, which allow a higher degree of control of the transmission electromagnetic field. This may provide several advantages, including improvement in RF safety in some imaging setups by reducing the transmission electrical field coupled to metallic parts (such as implants or guidewires), reduction in inhomogeneity of the transmission magnetic field at high field MRI, and in some cases, acceleration of the excitation without sacrificing image quality. However, conventional parallel transmission techniques have encountered issues with scaling, fidelity, and synchronization.

Multi-transmitter MRI systems often include parallel RF multiple, individually powered, single channel, analog RF transmitters for the parallel transmission. However, such systems often include performance issues, such as difficulty in scaling, radiation coupling between transmission lines, cable losses, requirement of impedance matching circuits, and other issues. Furthermore, due to the high levels of power used by such systems and use of magnetic parts, the RF power amplifier and/or control systems for the multi-transmitter MRI may be installed in an isolated equipment room, separate from the MRI room, requiring cable connections between power amplifiers and the coils of the MRI. These wired connections increase the size and cost of the MRI systems. Also, the transmission lines used to connect the various equipment of the MRI system may require careful engineering to avoid cross-talk or other interference, especially in high-field implementations of the MRI system, which can degrade performance and efficiency of the MRI transmission system.

It is with these observations in mind, among others, that various aspects of the present disclosure were conceived and developed.

SUMMARY

Embodiments of the present disclosure provide a dual-tuned, optically controlled, on-coil amplifier for high field magnetic resonance imaging systems.

In accordance with a first aspect of the present disclosure, an amplifier for a magnetic resonance imaging system is disclosed. The amplifier includes a broadband interface circuit and a dual-tuned amplification circuit. The broadband interface circuit includes a broadband preamplifier circuit, a first dual resonance tuning circuit, and a push-pull preamplifier. The broadband interface circuit processes an optical carrier signal to generate an output radio frequency (RF) signal at a first frequency to create a first nuclear magnetic resonance in a material receiving an RF signal at the first frequency. The dual-tuned amplification circuit includes a second dual resonance tuning circuit in electrical communication with a current-mode amplifier. The dual-tuned amplification circuit amplifies the output RF signal to an amplified RF signal. The dual-tuned amplification circuit is capable of being engaged to at least one imaging coil of the magnetic resonance imaging system configured to receive the amplified RF signal.

In accordance with one embodiment of the first aspect, the optical carrier signal comprises a frequency from 50 megahertz to 800 megahertz.

In accordance with one embodiment of the first aspect, the first dual resonance tuning circuit includes a first inductor-capacitor (LC) circuit. An inductor of the first LC circuit is controllable to tune the first dual resonance tuning circuit to the first frequency.

In accordance with one embodiment of the first aspect, the second dual resonance tuning circuit includes a second inductor-capacitor (LC) circuit, wherein an inductor of the second LC circuit is controllable to tune the second dual resonance tuning circuit to the first frequency.

In accordance with one embodiment of the first aspect, the current-mode amplifier includes an on-coil, current-mode class D (CMCD) amplifier to drive the at least one imaging coil of the magnetic resonance imaging system.

In accordance with one embodiment of the first aspect, the broadband interface circuit processes the optical carrier signal to generate a second output RF signal at a second frequency different than the first frequency to create a second nuclear magnetic resonance in a material sensitive to an RF signal at the second frequency.

In accordance with one embodiment of the first aspect, the push-pull preamplifier includes: a first field effect transistor (FET) controlled by a first output signal of the first dual resonance tuning circuit; and a second FET controlled by a second output signal of the first dual resonance tuning circuit in a push pull configuration.

In accordance with one embodiment of the first aspect, the at least one imaging coil of the magnetic resonance imaging system comprises a dual-resonance coil.

In accordance with one embodiment of the first aspect, the at least one imaging coil of the magnetic resonance imaging system comprises a plurality of nested single-resonance coils.

In accordance with one embodiment of the first aspect, the amplifier further includes a dual-tuned filter in electrical communication between the dual-tuned amplification circuit and the at least one imaging coil.

In accordance with one embodiment of the first aspect, the dual-tuned amplification circuit includes a plurality of single-frequency resonance tuning circuits each electrically connected to a corresponding current-mode amplifier circuit.

In accordance with one embodiment of the first aspect, at least one of the first dual resonance tuning circuit or the second dual resonance tuning circuit includes: a gallium nitride (eGaN) field effect transistor (FET) device; and an inductor. A drain connector of the eGaN FET device is connected to a first end of the inductor, and the output RF signal is connected between a second end of the inductor and a source connector of the eGaN FET device. The drain connector of the eGaN FET device is connected to an optically controlled voltage modulation circuit that generates a rectified voltage in accordance with a pulse duration of an optical tuning signal. The optical tuning signal has a frequency between 1 MHz and 20 MHz. In accordance with one embodiment of the first aspect, the optical tuning signal has a frequency of 10 MHz.

In accordance with a second aspect of the present disclosure, magnetic resonance imaging system is disclosed. The magnetic resonance imaging system includes: a plurality of coils including at least one transmit coil and at least one receive coil; a controller coupled to an optical interface including one or more optical transmitters; and at least one radio frequency power amplifier (RFPA) circuit. Each RFPA circuit is engaged to a corresponding transmit coil, the RFPA circuit including: a broadband interface circuit and a dual-tuned amplification circuit. The broadband interface circuit includes a broadband preamplifier circuit, a first dual resonance tuning circuit, and a push-pull preamplifier. The broadband interface circuit processes an optical carrier signal to generate an output radio frequency (RF) signal at a first frequency to create a first nuclear magnetic resonance in a material receiving an RF signal at the first frequency. The dual-tuned amplification circuit includes a second dual resonance tuning circuit in electrical communication with a current-mode amplifier. The dual-tuned amplification circuit amplifies the output RF signal to an amplified RF signal. The dual-tuned amplification circuit engaged to the corresponding transmit coil.

In accordance with one embodiment of the second aspect, the at least one transmit coil includes a dual-resonance coil.

In accordance with one embodiment of the second aspect, the at least one transmit coil includes a plurality of nested single-resonance coils.

In accordance with one embodiment of the second aspect, the controller includes: at least one processor; and a memory storing instructions that, responsive to being executed by the processor, cause the processor to control the one or more optical transmitters to generate optical signals transmitted to the at least one RFPA circuit via at least one optical cable.

In accordance with one embodiment of the second aspect, the RFPA circuit further includes a loop sensor, a RF monitoring circuit, and an optical transmitter configured to transmit an optical feedback signal to the controller.

In accordance with one embodiment of the second aspect, at least one of the first dual resonance tuning circuit or the second dual resonance tuning circuit includes: a gallium nitride (eGaN) field effect transistor (FET) device; and an inductor. A drain connector of the eGaN FET device is connected to a first end of the inductor. The output RF signal is connected between a second end of the inductor and a source connector of the eGaN FET device. The drain connector of the eGaN FET device is connected to an optically controlled voltage modulation circuit that generates a rectified voltage in accordance with a pulse duration of an optical tuning signal.

DETAILED DESCRIPTION

Aspects of the present disclosure involve systems, devices, apparatus, methods, and the like, for an optically controlled, multi-transmitter magnetic resonance imaging system for multi-nuclear, high field applications. In one embodiment, the MRI system may include a dual-tuned radio-frequency (RF), on-coil power amplifier for amplifying RF power signals at two or more frequencies for the multi-nuclear excitations for use in a dual-tuned coil MRI device or a nested coil MRI device. In one particular implementation, the dual-tuned amplifier of the MRI system may receive optical carrier signals through the broadband optical interface to control the on-coil amplifiers. The amplifier may include input circuitry for a pre-amplification and a Current-Mode Class-D (CMCD) amplification stage tuned for multi-nuclei frequencies through dual-resonance LC networks. A path for harmonics currents, generated from the switch-mode amplification may be provided by an output filter directly connected to a dual-tuned MRI apparatus. Through the systems and methods described herein, a dual-tuned, on-coil transmission system is provided that allows for multinuclear excitation without the need of additional matching networks, cable traps, and coaxial connections used in previous MRI systems. This approach may simplify the implementation of a multi-nuclear, multi-channel MRI systems compared to those built based on 50 ohm broadband voltage amplifiers typically found in MRI systems with multinuclear capability.

Figure 1:
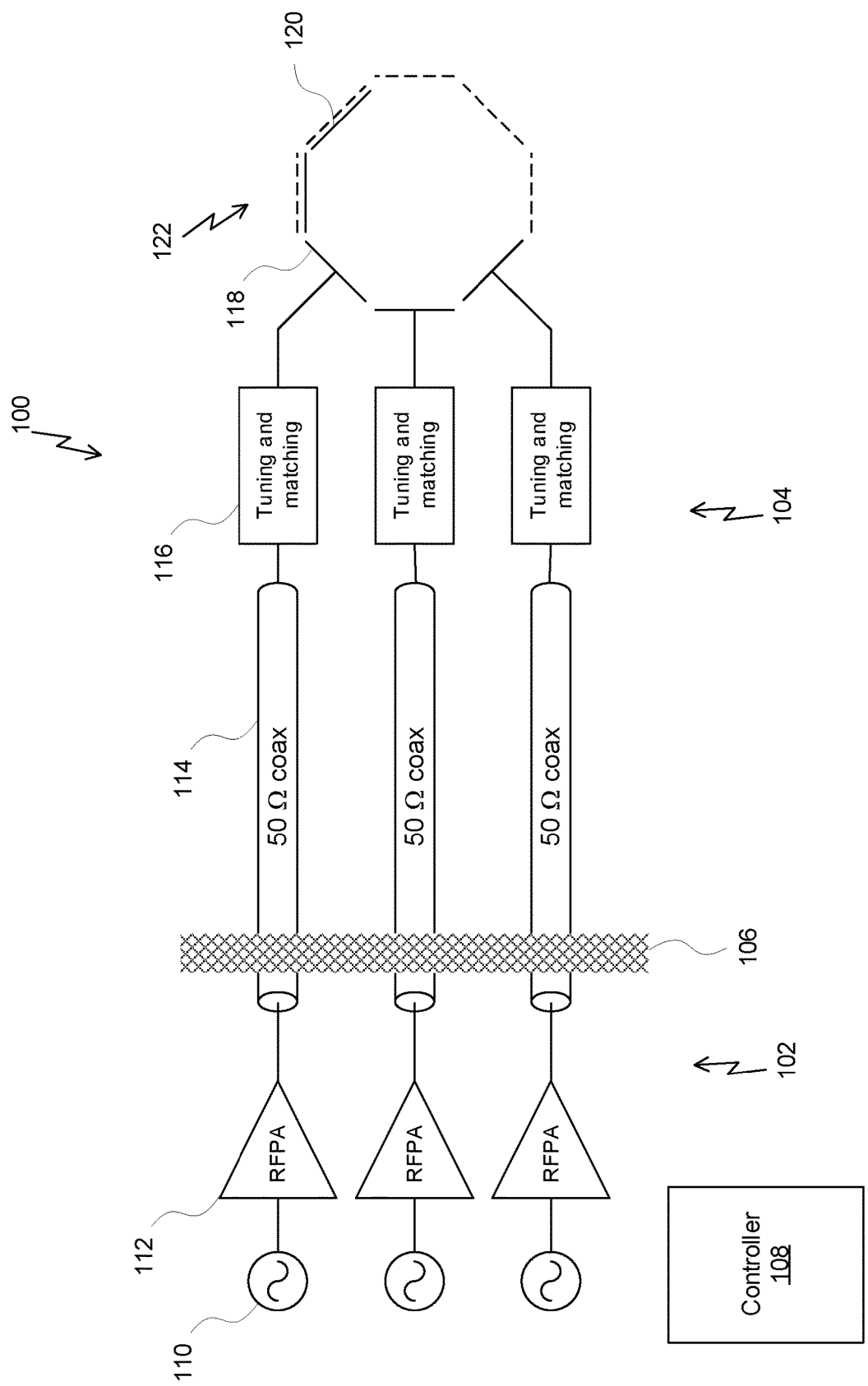
FIG. 1 is a schematic diagram illustrating a prior art multi-transmitter magnetic resonance imaging system.

FIG. 1 is a schematic diagram illustrating a prior art multi-transmitter magnetic resonance imaging (MRI) system 100. The MRI system 100 may include a controller 108 to control and provide an input signal 110 to a plurality of transmission circuits. Each transmission circuit may include a radio-frequency (RF) power amplifier 112 receiving and amplifying the input signal 110, and a transmission line 114 transmitting the amplified signal to a tuning and matching circuit 116. In general, the tuning and matching circuit 116 tunes the MRI apparatus 122 and matches its input impedance to 50 ohm at the MRI resonance frequency. In general, the MRI apparatus 122 may include one or more transmit coils 118 and one or more receive coils 120. The MRI apparatus 120 may also include other standard MRI components (e.g., main field magnet, gradient coils, etc.) Prior art MRI systems may include a single transmit coil 118 providing the tuned signal to a single receive coil 120, a single transmit coil 118 providing the tuned signal to multiple receive coils 120 for parallel acquisition, or multiple single transmit coils 118 providing multiple tuned signals to multiple receive coils 120 for parallel acquisition and parallel transmission. As shown in FIG. 1, the MRI system 100 includes multiple transmit coils 118 and multiple receive coils 120. The receive coils 120 may generally be located inside the transmit coils, although in some systems the receive coils 120 and transmit coils 118 can be the same coil, coupled to a switch that alternates connecting the coil to the transmitter or receiver circuitry. The MRI system 100 creates a magnetic field or magnetic gradient with the MRI apparatus 122 at various frequencies to excite nuclei of a patient or other object within the MRI apparatus 122. More particularly, the system 100 may generate radio frequency energy that is absorbed by atomic nuclei when placed within the magnetic field. The resultant spin polarization of the atomic nuclei induces a corresponding RF signal that is detected by the receive coils 120 of the MRI apparatus 122.

Prior art MRI systems, like MRI system 100 illustrated in FIG. 1, may suffer from several limitations, including scaling, synchronization, interference between coils, and so on. For example, each transmit coil 118 of the MRI apparatus 122 may be powered by a separate power transmitter 110 and is connected via a separate coaxial cable 114. Thus, scaling of the system 100 is difficult due to power transmitter proliferation, tuning and matching requirements, cable proliferation and coupling, and power consumption increases. In addition, cable paths and coil design may produce cross talk issues, interference issues, and so on between the various transmission circuits of the system 100. Construction of the system 100 also includes several inefficiencies due to the power involved and the sensitivity of the components used. For example, installation of MRI systems 100 like that of FIG. 1 typically include the high-power sources 110 and power amplifiers 112 in an equipment room 102 separate from a MRI room 104 in which the MRI apparatus 122 is located, connected through the transmission lines 114. In many instances, a physical barrier 106, such as a wall, may separate the equipment room 102 from the rest of the downstream MRI system 100 in room 104, requiring significant construction and installation costs to install the system 100. In some instances, a Faraday cage may also be constructed around the entirety of the MRI room 104. The inclusion of the transmission lines 114, typically coaxial cables, can introduce crosstalk and interference in the system 100 if careful engineering is not applied (e.g. spacing and cable trapping).

Figure 2:
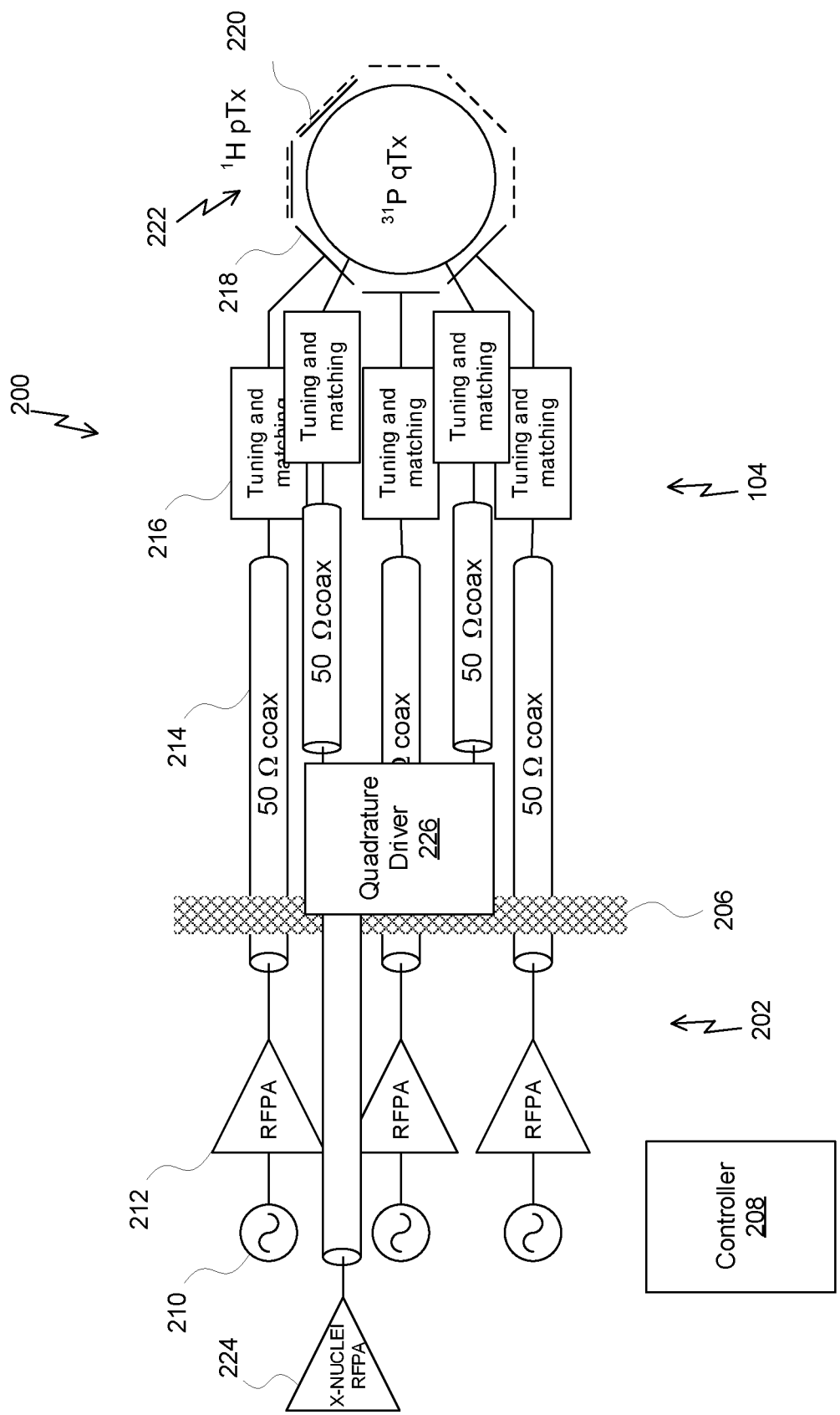
FIG. 2 is a schematic diagram illustrating a prior art multi-transmitter, multi-nuclear magnetic resonance imaging system.

In some instances, prior art MRI systems have been developed for multi-nuclear excitation. FIG. 2 is a schematic diagram illustrating one such prior art multi-transmitter, multi-nuclear magnetic resonance imaging system 200. Several of the components of the system 200 are the same or similar to the prior art system 100 discussed above, including a controller 208, power signal 210, RF power amplifier 212, transmission line 214, tuning and matching circuit 216, and an MRI apparatus 222 that includes a transmission coil 218 and a receive coil 220. However, in this implementation, the MRI apparatus 222 is configured to operate at different frequencies for excitation of different nuclei, either through a dual-tuned coil configuration or a nested coil configuration. To accommodate the multi-nuclear capabilities, the MRI system 200 may include one or more parallel transmission circuits 224 tuned to generate an RF signal for an x-nuclei, including an x-nuclei RF power amplifier, quadrature driver circuit 226, transmission lines, and tuning and matching circuits as described above. Control of the various parallel transmission circuits by controller 208 determines the nuclei excited within the magnetic field generated by the MRI apparatus 222. However, such MRI systems 200 exacerbate the drawbacks of other single frequency MRI systems, including interference between the transmission lines, cable losses, and coil interference, because the amount of hardware is increased and cable connections need to be engineered to avoid coupling at multiple frequencies.

Figure 3:
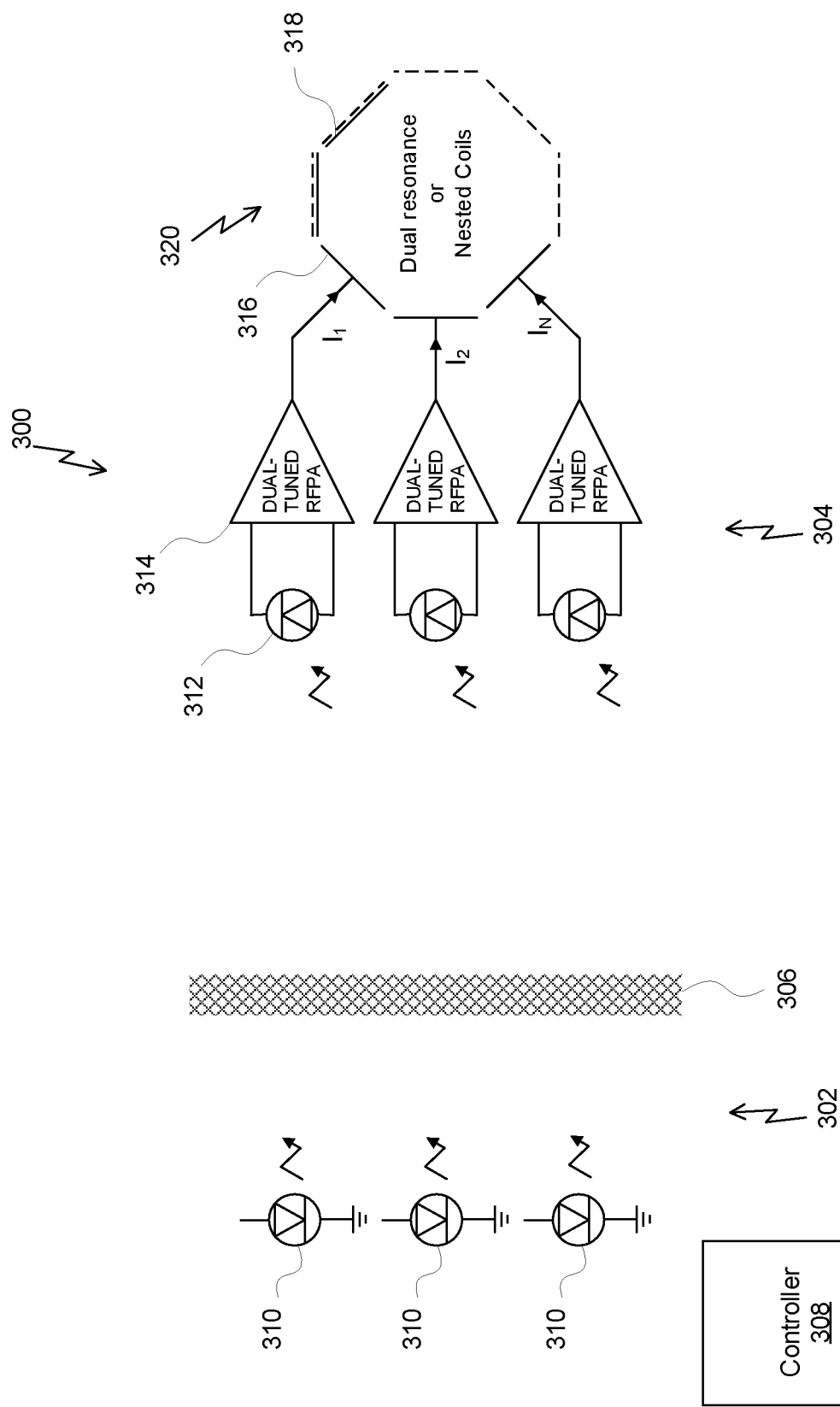
FIG. 3 is a schematic diagram illustrating an optically controlled, multi-transmitter magnetic resonance imaging system, in accordance with one embodiment.

In response to the above, several improvements over previous MRI system designs are introduced. In particular, FIG. 3 illustrates an optically controlled, multi-transmitter magnetic resonance imaging system 300 in accordance with one embodiment of the present disclosure. The MRI system 300 of FIG. 3 overcomes many of the deficiencies of previous MRI systems discussed above via an optically-controlled, dual-tuned, on-coil power amplifier that provides for high-field, multi-nuclear control of a dual resonance MRI apparatus while removing many of the losses and interferences of previous MRI systems.

Similar to the systems above, the MRI system 300 of FIG. 3 includes multiple transmission circuits to control multiple transmit coils 316 of the MRI apparatus 320. However, the transmission circuits may be optically-controlled such that the power amplifiers 314 may be on or near the transmit coils 316 of the MRI apparatus 320. More particularly, the MRI system 300 may include a controller 308 to control one or more optical transmitters 310 in communication with the controller 308. The optical transmitters 310 may convert power and/or control signals into optical signals for transmission via an optical cable or other optical transmission medium. The controller 308 and optical transmitters 310 may be located in an equipment room 302 of the MRI site, similar to above. In one particular implementation, each transmission circuit of the multi-transmitter MRI system 300 may include an optical transmitter 310, although other configurations are contemplated. Each optical transmitter 310 may be paired with a corresponding optical receiver 312, also associated with a transmission circuit of the MRI system 300. The optical transmitter 310 and corresponding receiver 312 may therefore communicate or exchange signals via an optical cable. In one particular implementation, a RF signal may be transmitted via the optical connection for use in controlling the MRI apparatus 320, discussed in more detail below. The use of the optical connection for signal delivery and control may reduce or eliminate the cross-talk, interference, and/or loss typical in coaxial or other transmission lines used in prior MRI systems.

Located in an MRI room 304 separated from the equipment room 302 by physical barrier 306, each optical receiver 312 may be connected to a corresponding on-coil RF power amplifier circuit 314. Although described herein as being "on-coil", it should be appreciated that the amplifiers 314 may be connected to or in electrical communication with the MRI apparatus 320 in various ways and may not necessarily be located on the transmitting coil 316. However, the power amplifier 314 of FIG. 3 may be configured so that the amplifier may be located near the MRI apparatus 320, such as in MRI room 304. Previous power amplifier circuits were not presented to operate near the multinuclear MRI apparatus 320. A conventional linear or quasi-linear RF amplifier may not be located near or on the MRI apparatus 320. A linear or quasi-linear RF amplifier presents high power losses and therefore requires large heatsinks (usually magnetic), and may require connection to a water cooling system. Therefore, such power amplifiers are typically located in the equipment room 302 and connected to the MRI apparatus via transmission lines, resulting in the losses and interferences discussed above.

In one implementation, the on-coil power amplifiers 314 may be current-sourced switch-mode RF amplifiers. In particular, each power amplifier 314 may provide a current signal to a corresponding transmitter coil 316 to generate a high-field magnetic flux within the MRI apparatus 320. Receiving coils 318 may receive RF signals generated via excited nuclei of an object within the magnetic field of the MRI apparatus 320 to obtain the MRI image. Further, in some implementations, the on-coil amplifiers 314 may be dual-tuned amplifiers configured to accommodate multi-nuclear capabilities of the MRI system 300. For example, the MRI apparatus 320 may include dual resonance or nested coils for multi-nuclear excitations. The on-coil amplifiers 314 may therefore be tuned to provide an RF signal for an x-nuclei corresponding to a transmission coil 316 and receive coil 318 pair of the MRI apparatus 320. In one example, the MRI apparatus may include $^{1}H$-$^{31}P$ dual resonance coils for which the dual-tuned amplifiers 314 may be tuned accordingly. Particular implementations of the power amplifier 314 of the system 300 is described in more detail below with reference to FIGS. 5-7B.

Figure 4:
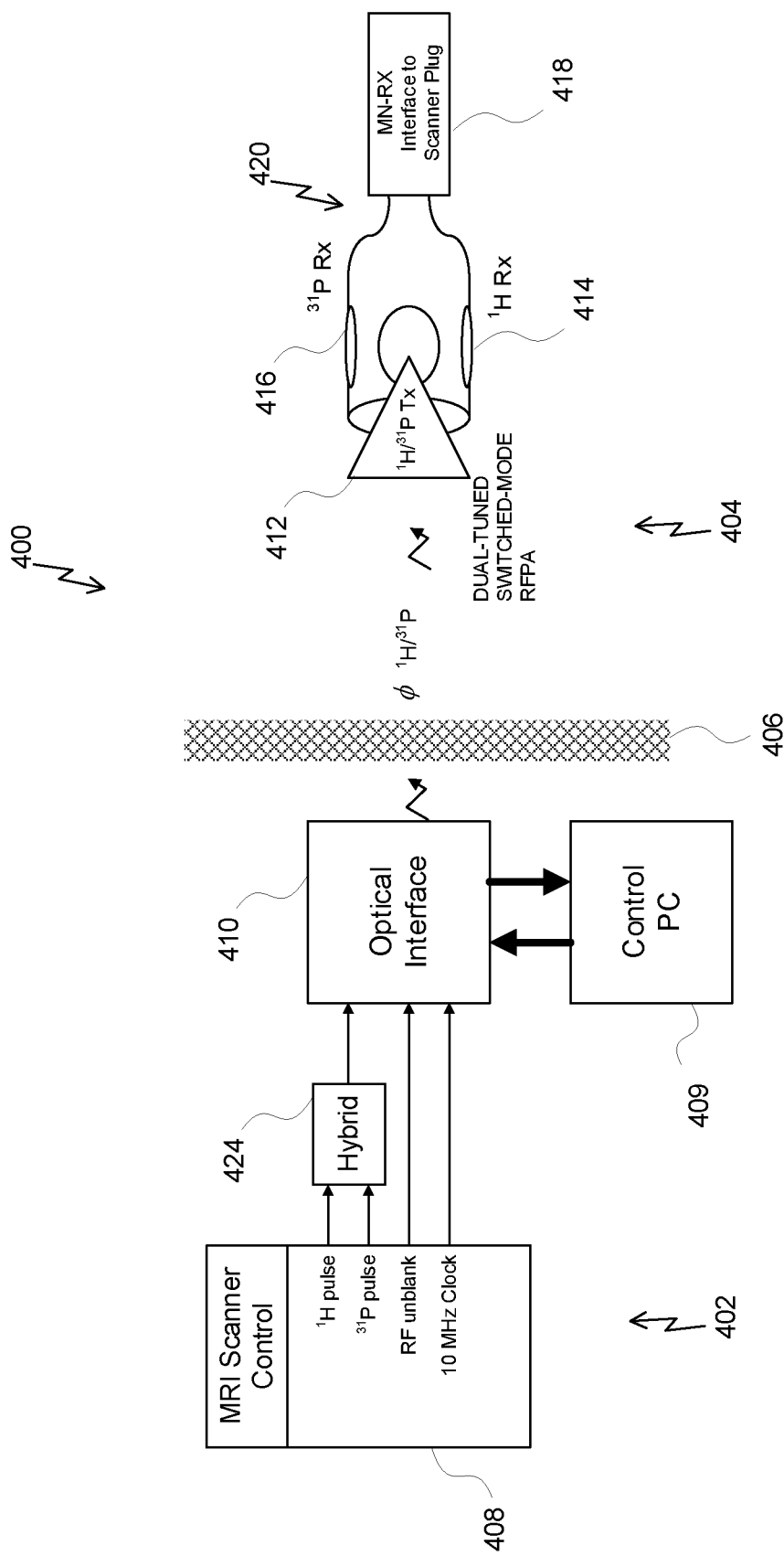
FIG. 4 is a schematic diagram illustrating a control system for an optically controlled, multi-transmitter magnetic resonance imaging system, in accordance with one embodiment.

Through the on-coil, dual-tuned, optically controlled amplifiers 314 of the MRI system 300, a multi-nuclear, high-field, parallel transmission MRI system 300 may be provided. FIG. 4 illustrates a control system for an optically controlled, multi-transmitter magnetic resonance imaging system 400 in accordance with one embodiment. The control system illustrated is one example of such a system. It should be appreciated that other control schemes control of the on-coil, dual-tuned, optically controlled amplifiers 412 of the MRI system 400 may be used, including controllers with additional or fewer components.

The MRI system 400 of FIG. 4 includes many of the same or similar components as the MRI system 300 described above with reference to FIG. 3. For example, the MRI system 400 may include a scanner controller 408, an optical interface 410 controlled by a computing system 409, a dual-tuned, on-coil RF amplifier 412, and a dual resonance MRI apparatus 420 including receive coils 414, 416 to receive high-field electromagnetic signals at different frequencies. It will be appreciated that the transmit coil(s) connected to the on-coil RF amplifier 412 are not explicitly shown in FIG. 4. In some implementations, the optical interface 410 may include vector modulation circuits controlled from one or more additional computing devices or circuits, such as control PC 409. The particular embodiment illustrated in FIG. 4 supports a $^{31}P$ receive coil 416 and a $^{1}H$ receive coil 414, although other nuclei-specific frequencies may be supported by the system 400. As such, the controller 408 of the MRI system 400 may include a pulse generator from which various signals of varying amplitude and phase may be generated by the optical control interface 410 via the vector modulation circuits as controlled by controller 409. The controller 408 may also generate one or more control signals for the optical control interface 410, such as a clock signal. The optical control interface 410 may transmit the received RF pulse to the dual-tuned RF amplifier 412 over an optical signal. The on-coil amplifier 412 may be tuned to amplify either component of the combined RF pulse to determine which of the receive coils 414, 416 of the MRI apparatus 420 are used to generate the MRI image. A receiving interface 418 may be connected to the receiving coils 414, 416 of the MRI apparatus 420 for obtaining the imaging data from the receiving coils 414, 416. In this manner, the control system 408 of the MRI system 400 may provide a multi-frequency RF pulse signal to the MRI system 400 for use in obtaining a multi-nuclear, high-field image from the MRI apparatus 420.

Figure 5:
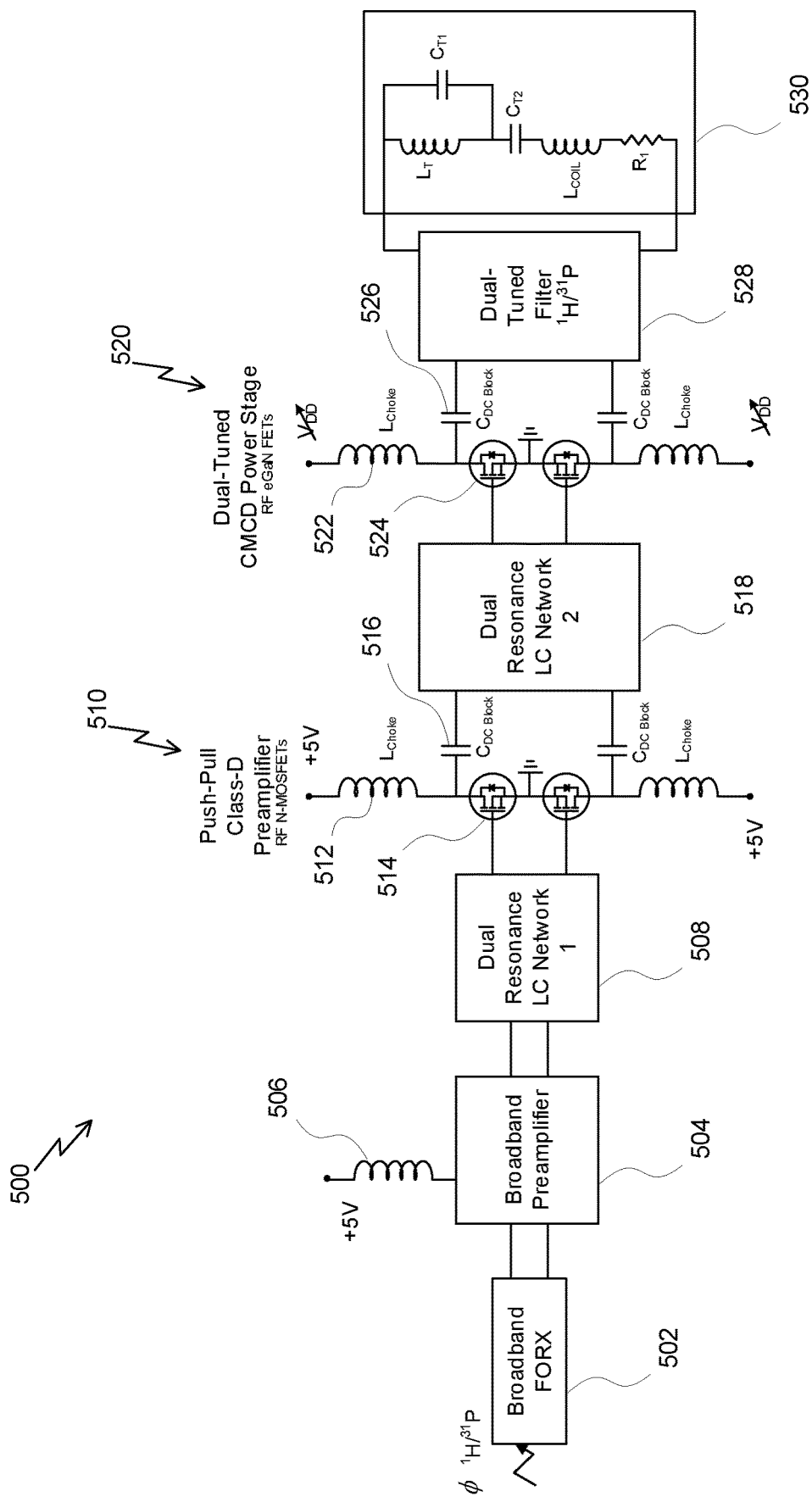
FIG. 5 is a schematic diagram illustrating a first dual-tuned, optically controlled, on-coil amplifier for a high-field magnetic resonance imaging system, in accordance with one embodiment.

FIG. 5 is a schematic diagram illustrating a first dual-tuned, optically controlled, on-coil amplifier 500 for a high-field magnetic resonance imaging system, in accordance with one embodiment. In some instances, the amplifier 500 of FIG. 5 may be the dual-tuned RF power amplifier 314 of the MRI system 300 of FIG. 3, where optical receiver 502 (i.e., broadband fiber optical receiver (FORX)) corresponds to optical receiver 312. The illustrated amplifier 500 is but one example of a dual-tuned, on-coil amplifier that may be used with the previously described MRI systems. More or fewer components may be included in other instances of the amplifier 500 and/or the illustrated components may be connected in alternate configurations. The amplifier 500 may provide a dual-tuned RF signal to power a dual resonance MRI apparatus, as explained in more detail below.

As mentioned above, the amplifier 500 may be controlled through one or more optical signals. As such, the amplifier 500 may include an optical receiver 502 for receiving an optical RF signal or pulse. In some instances, the RF signal may include two or more harmonics corresponding to excitation of two or more nuclei of objects within the MRI apparatus, as described above. However, any RF signal may be received optically at the optical receiver 502. The optical signal may be provided by an optical control interface under control by an MRI controller. The optical receiver 502 may be connected to or in electrical communication with a broadband preamplifier circuit 504. The preamplifier circuit 504 may prepare the RF signal for amplifying and/or other processing by removing noise from the RF signal. In one instance, a preamplifier inductor 506 may be connected between a rail voltage (such as a 5 volt power rail) and the preamplifier circuit 504. In addition, the preamplifier 504 may be configured to receive and process a broadband RF signal. In one particular instance, the RF signal may vary between 50 MHz and 800 MHz, depending on the configuration of the target MRI apparatus to which amplifier circuit 500 is connected.

The broadband preamplifier circuit 504 may be electrically connected to a first dual resonance inductor-capacitor (LC) network 508 or other type of dual resonance circuit. The first LC network 508 may include variable components, such as a variable inductor and/or a variable capacitor, that are tunable to generate an output at a particular or target frequency. In this manner, the first LC network 508 may be tuned to pass a particular harmonic of the received RF signal based on the tuning of the variable components of the first LC network. The tuned output signal of the first LC network 508 may be provided to a push-pull class-D preamplifier circuit 510. The push-pull preamplifier circuit 510 may include one or more transistor-inductor-capacitor circuits. More particularly, an inductor 512 may be connected between the rail voltage and the drain connector of a transistor device 514. The output of the first LC network 508 may be connected to the gate connector of the transistor device 514, and the source connector of the transistor device may be connected to ground. A direct-current (DC) blocking capacitor 516 may be connected between the drain connector and the output of the push-pull preamplifier circuit 510. Two such transistor-inductor-capacitor circuits may be included in the preamplifier circuit 510 to provide the push-pull feature to the preamplifier circuit 510. In one embodiment, the transistor devices 514 may be RF N-MOS-FET type transistors, although other types of transistor devices may be used.

A second LC network 518 or other resonance circuit may be connected to the output of the push-pull preamplifier circuit 510. Similar to the first LC network 508, the second LC network 518 may include variable components, such as a variable inductor and/or a variable capacitor, that are tunable to generate an output at a particular or target frequency. In this manner, the second LC network 518 may also be tuned to pass a particular harmonic of the received RF signal based on the tuning of the variable components. The tuned output signal of the second LC network 518 may be provided to a dual-tuned current-mode class-D (CMCD) amplifier circuit 520. The CMCD amplifier 520 may produce higher efficiency at higher output power than class-D or class-E amplifiers. As the load may be driven by the amplifier 520 (e.g., does not require tuning and matching to a 50 ohm network), the amplifier may be referred to as a "current mode" amplifier. The CMCD amplifier 520 may include a similar configuration as the push-pull preamplifier 510 with one or more transistor-inductor-capacitor circuits. More particularly, a choke inductor 522 may be connected between the voltage and the drain connector of a transistor device 524. The CMCD amplifier 520, however, may include a voltage signal ($V_{DD}$) connected to the inductor 522 that is modulated by an amplified version of the RF envelope signal. In addition to the RF carrier, the RF envelope signal can also be transmitted from the optical control interface. This signal could be optically received on the amplifier side and amplified by an envelope switch-mode amplifier, which has an output connected to inductor 522. This modulation is necessary to generate high power shaped RF excitation pulses in this switch-mode amplifier topology. The output of the second LC network 518 may be connected to the gate connector of the transistor device 524, and the source connector of the transistor device may be connected to ground. A direct-current (DC) blocking capacitor 526 may be connected between the drain connector and the output of the CMCD amplifier circuit 520. In one instance, two such transistor-inductor-capacitor circuits may be included in the CMCD amplifier circuit 520. Further, in one embodiment, the transistor devices 524 may be RF gallium nitride (eGaN) FET-type transistors, although other types of transistor devices may be used.

The amplifier circuit 500 may further include a dual-tuned filter circuit 528 connected to the output of the CMCD amplifier circuit 520. The filter circuit 528 may be tunable or adjustable to filter the amplified RF signal to pass a particular frequency. For example, the filter circuit 528 may be tuned to filter a received amplified RF signal and provide a tuned RF signal for an x-nuclei corresponding to a transmission coil and receive coil pair of a connected MRI apparatus 530. In one example, the MRI apparatus 530 may include $^1$H-$^{31}$P dual resonance coils for which the dual-tuned components of the power amplifier 500, including filter circuit 528, may be tuned accordingly. As such, a dual resonance MRI apparatus 530 may be connected to the output of the filter 528 to receive the amplified, filtered RF signal to operate the MRI apparatus 530. Through the components and circuits of the power amplifier 500, an optically-controlled, dual-tuned RF signal may be used to control the MRI apparatus 530 to provide multi-nuclei excitation and imaging via the MRI apparatus 530. The MRI apparatus 530 may include dual-tuned coils for multi-nuclei operation.

One or more of the components and/or circuits of the power amplifier 500 discussed above may be tuned to amplify, filter, or provide an RF signal at a particular frequency. In some instances, the components and/or circuits may be manually tuned to provide the RF signal at the desired frequency. In other instances, the controller of the MRI system described above may be configured to provide control and/or tuning signals to the tunable components and circuits of the amplifier 500 to automatically adjust the components. For example, the controller may receive a feedback signal from one or more components of the MRI system and, in response to the feedback signal, adjust the tunable components of the amplifier 500. In another example, a user of the MRI system may provide a signal to the controller to select a particular operational frequency for the MRI apparatus 530 and, in response to the selection, the controller may alter one or more components of the amplifier 500.

Figure 6:
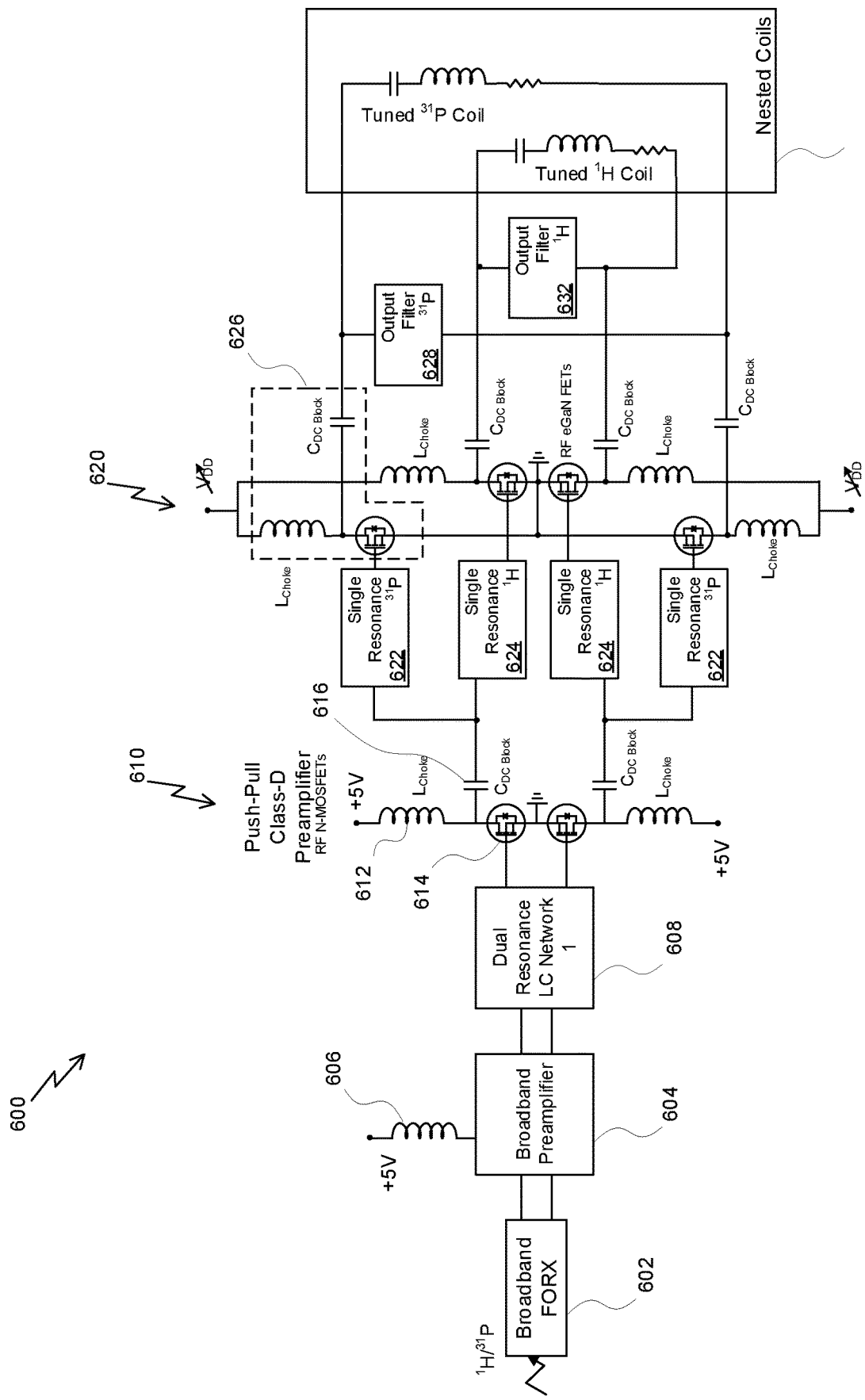
FIG. 6 is a schematic diagram illustrating a second dual-tuned, optically controlled, on-coil amplifier for a high-field magnetic resonance imaging system, in accordance with one embodiment.

FIG. 6 is a schematic diagram illustrating a second dual-tuned, optically controlled, on-coil amplifier 600 for a high-field magnetic resonance imaging system in accordance with one embodiment. Similar to the amplifier of FIG. 5, the second dual-tuned, optically controlled, on-coil amplifier 600 may be used with the previously described MRI systems. More or fewer components may be included in other instances of the amplifier 600 and/or the illustrated components may be connected in alternate configurations. The amplifier 600 of FIG. 6 may, in some instances, be utilized for MRI apparatus that have nested coils for multi-nuclei operation, as opposed to the dual resonance coils discussed above with reference to FIG. 5. As such, the amplifier 600 of FIG. 6 may include several components that are the same or similar to the components and circuits of FIG. 5. For example, the amplifier 600 may include a broadband optical receiver 602 to receive an RF signal from an optical transmitter. The amplifier 600 may also include a broadband preamplifier 604 connected to a preamplifier inductor 606 and a first LC network 608. The operations of these components and circuits may be similar to those described above with reference to FIG. 5.

Also similar to the above amplifier 500, the amplifier 600 of FIG. 6 may include push-pull class-D preamplifier circuit 610. The push-pull preamplifier circuit 610 may include one or more transistor-inductor-capacitor circuits. More particularly, an inductor 612 may be connected between the rail voltage and the drain connector of a transistor device 614. The output of the first LC network 608 may be connected to the gate connector of the transistor device 614, and the source connector of the transistor device 614 may be connected to ground. A direct-current (DC) blocking capacitor 616 may be connected between the drain connector and the output of the push-pull preamplifier circuit 610. Two such transistor-inductor-capacitor circuits may be included in the preamplifier circuit 610 to provide the push-pull feature to the preamplifier circuit. In one embodiment, the transistor devices 614 may be RF N-MOSFET type transistors, although other types of transistor devices may be used.

In place of a second LC network as described above, the amplifier 600 may include paired single resonance circuits corresponding to an operational frequency of the nested coils of the MRI apparatus 630. Additional paired single resonance circuits may be included in the amplifier 600 corresponding to additional frequencies of x-nuclei used to power additional nested coils, but these circuits are not illustrated in FIG. 6 for simplicity. In other embodiments, a pair of single resonance circuits tuned to a frequency of the 1H resonance can be paired with a pair of adaptable single resonance circuits capable of being tuned to one of the x-nucleus frequencies. The adaptable single resonance circuits can be tuned, for example, using a variable inductor in the single resonance circuits. This implementation may require careful design of an output filter 628 that provides a path for at least the first harmonics corresponding to each of the selected frequencies. In yet other embodiments, two or more pairs of single resonance circuit could be adaptable to select different x-nucleus frequencies. In the example shown in FIG. 6, a first pair of resonance circuits 622 may be connected to the output of the push-pull preamplifier 610 to provide an RF signal at a particular frequency. In one instance, the pair of single resonance circuits 622 may be tuned to drive a $^{31}$P transmit coil of the nested coil MRI apparatus 630. A second pair of single resonance circuits 624 may also be connected to the output of the push-pull preamplifier 610 to provide an RF signal at a different frequency. In one instance, the second pair of single resonance circuits 624 may be tuned to drive a $^{1}$H transmit coil of the nested coil MRI apparatus 630. Each of the single resonance circuits 622, 624 may be connected to a corresponding inductor-transistor-capacitor circuit 626 of a CMCD amplifier 620. Each inductor-transistor-capacitor circuit 626 of a CMCD amplifier 620 may be connected to the output of the corresponding single resonance circuit 622, 624 to amplify the RF signal provided by the resonance circuit.

The amplifier circuit 600 may further include one or more filter circuits 628, 632 connected to the outputs of the inductor-transistor-capacitor circuits 626. In particular, a first filter circuit 628 may be connected to the outputs of the inductor-transistor-capacitor circuits 626 corresponding to a first pair of single resonance circuits 622. A second filter circuit 632 may be connected to the outputs of the inductor-transistor-capacitor circuits 626 corresponding to a second pair of single resonance circuits 624. Each of the filter circuits 628, 632 may be configured to filter a received amplified RF signal and provide a tuned RF signal for an x-nuclei corresponding to a transmission coil and receive coil pair of a connected MRI apparatus 630. In particular, an MRI apparatus 630 with nested coils may utilize separate input signals to drive each coil of the nested coil MRI apparatus 630. Thus, the amplifier 600 of FIG. 6 may provide single resonance RF signals to the separate coils of the nested coils of the MRI apparatus 630 for the multi-nuclei operation of the nested coil MRI apparatus. In one example, the MRI apparatus 630 may include $^{1}$H-$^{31}$P nested coils for which the single resonant components of the power amplifier 600 may be tuned accordingly.

Figure 7A:
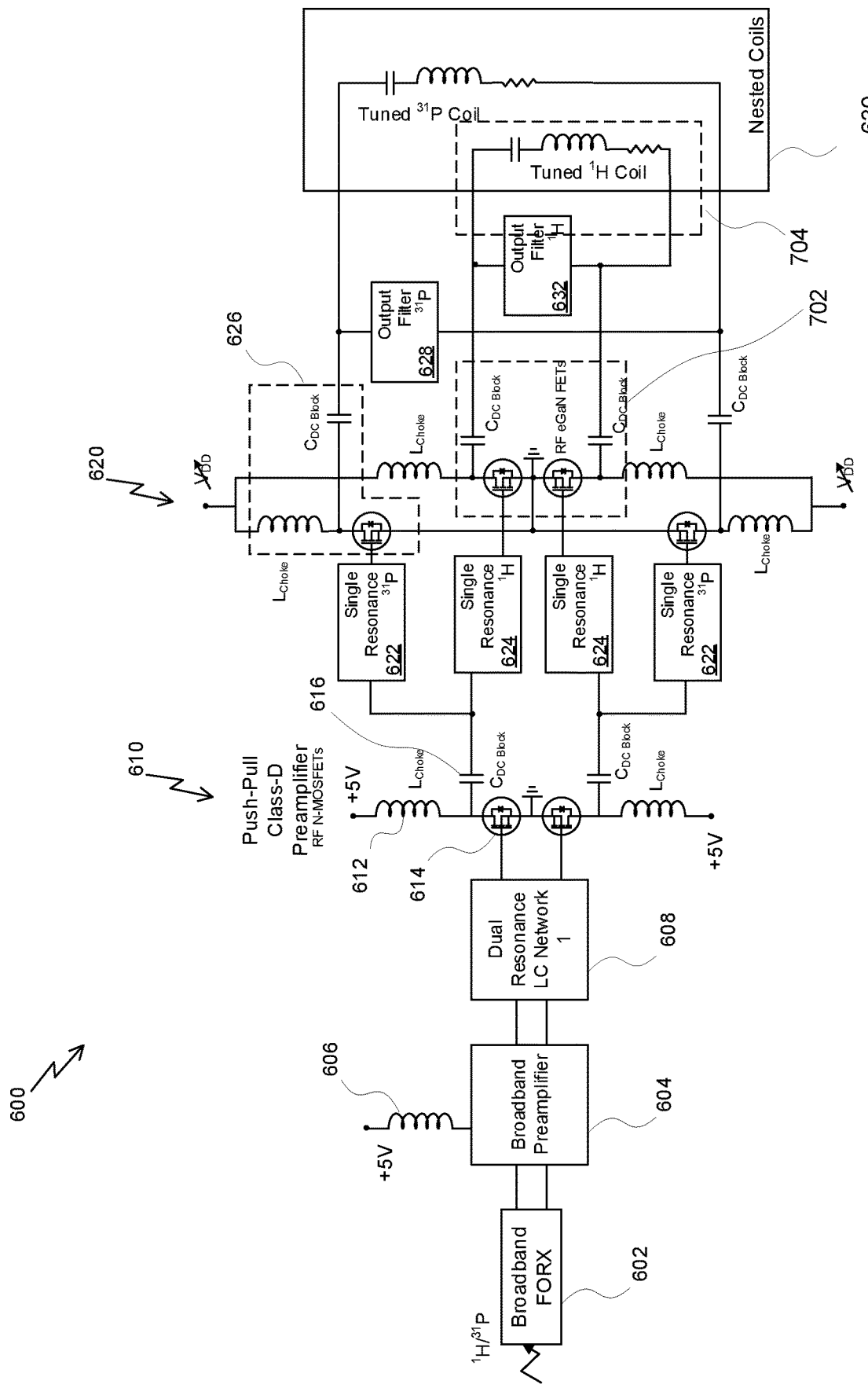
FIGS. 7A-7B illustrate the dual-tune operation of the second optically controlled, on-coil amplifier for a high-field magnetic resonance imaging system of FIG. 6, in accordance with one embodiment.
Figure 7B:
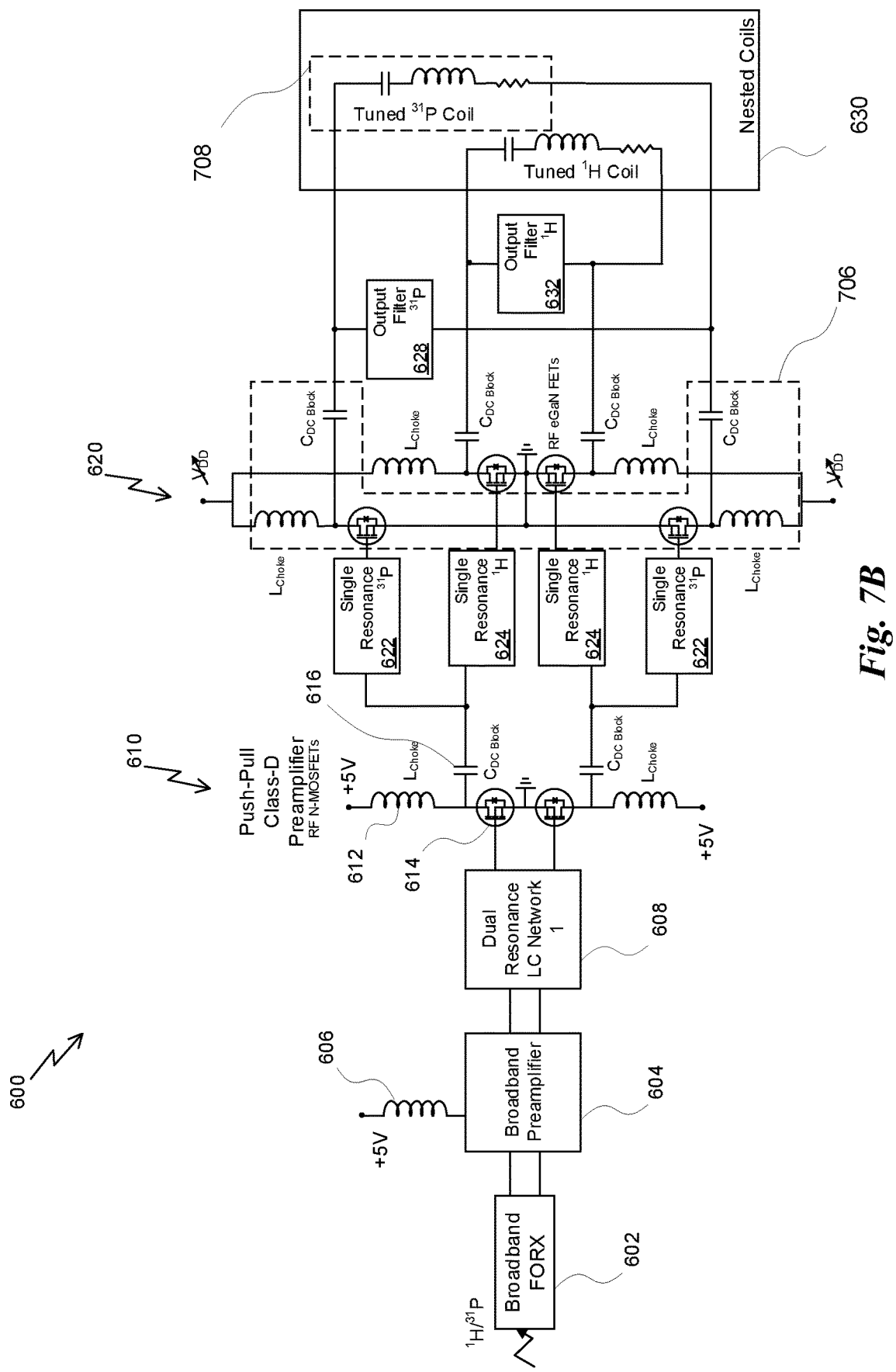

Operation of the amplifier 600 of FIG. 6 to drive the nested coil apparatus 630 is illustrated in FIGS. 7A and 7B. In particular, FIGS. 7A and 7B illustrate the dual-tune operation of the second optically controlled, on-coil amplifier 600 for a high-field magnetic resonance imaging system of FIG. 6 in accordance with one embodiment. The operation or utilization of particular components of the amplifier 600 for operation of one of the nested coils of the MRI apparatus 630 is illustrated by the dashed box 704. In particular and as shown in FIG. 7A, the amplifier components in dashed box 702 (connected to single resonance circuits 624) provide a first resonant frequency RF signal to a first coil (dashed box 704) of the nested coil MRI apparatus 630. Output filter circuit 632 may filter the amplified signal at the first frequency. Through this circuit, the output signal for single resonance circuits 624 may be amplified by the amplification circuit of dashed box 702 to drive the first coil 704 at the frequency for which the single resonance circuits 624 are tuned. In one particular implementation, single resonance circuits 624 may be tuned to excite $^{1}$H nuclei of an object in the magnetic field generated by the first coil 704. In a similar manner, FIG. 7B illustrates the amplifier 600 of FIG. 6 for operation of the other coil of the nested coils of the MRI apparatus 630. In particular, the amplifier components in dashed box 706 (connected to single resonance circuits 622) provide a second resonant frequency RF signal to a second coil (dashed box 708) of the nested coil MRI apparatus 630. Output filter circuit 628 may filter the amplified signal at the second frequency. Through this circuit, the output signal for single resonance circuits 626 may be amplified by the amplification circuit of dashed box 706 to drive the second coil 708 at the frequency for which the single resonance circuits 626 are tuned. In one particular implementation, single resonance circuits 626 may be tuned to excite $^{31}$P nuclei of an object in the magnetic field generated by the second coil 708.

The dual-tuned, on-coil transmission system 300 illustrated herein allows for multinuclear excitation without the need of additional matching networks, cable traps, and coaxial connections used in previous MRI systems. As such, this approach may simplify the implementation of a multinuclear, multi-channel MRI systems compared to those built based on 50 ohm broadband voltage amplifiers typically found in MRI systems with multinuclear capability. Although discussed above in relation to excitation of $^1$P and $^{31}$H nuclei, the dual-tuned circuits presented herein may be tuned to excite other X-nuclei (such as $^{23}$Na, $^{13}$C, $^{19}$F, etc.). In addition, the design of the gate circuit may be extended to allow for more than a dual-nuclei excitation. For example, a parallel transmission system as described herein may be transformed or controlled to excite different nuclei as necessary for different applications.

Results of Optically Controlled On-Coil Amplifier in High-Field MRI Test

In an experiment utilizing systems and methods described herein, an implementation of the dual-tuned amplifier 500 received optical carrier signals through the broadband optical Rx interface 502 to control on-coil amplifiers for $^1$H excitation. Input circuitry for the pre-amplification 510 and Current-Mode Class-D (CMCD) amplification stage 520 were designed to maximize the gate-source voltage to fully switch ON the FETs in both stages at $^1$H and X-nuclei frequencies through dual-resonance LC networks 508, 518. For this implementation, the LC networks 508, 518 were tuned for $^1$H (297.2 MHz) and $^{31}$P (120.3 MHz) excitation. A path for harmonics currents, generated from the switch-mode amplification 520, was provided by an output filter 528. The dual-resonance amplifier 500 was connected directly (not 50 ohm impedance matching) to a dual-tuned MRI apparatus 530. Hydrogen and phosphorus carrier signals were connected to the input ports of a hybrid combiner, the output of which was connected to the RF signal input of the optical interface box. Carrier signals were transmitted optically through a single fiber to the dual-tuned amplifier 500. Coil current amplitude and harmonic content was measured for both excitation frequencies with a calibrated probe coupled to the Tx coil and connected to a high-speed oscilloscope. The performance of the on-coil amplifier was compared to a single resonance $^1$H-tuned on-coil prototype. A preliminary multinuclear MR experiment was performed in a 7T MRI scanner. Carrier signals from the scanner control were connected to the in-house optical interface located in the scanner electronics room. Multinuclear excitation was performed with the new amplifier and Tx coil loaded with a $^{31}$P rich solution (50 mM potassium phosphate). Hydrogen and phosphorous signals were detected with surface loops tuned to the corresponding frequencies (120.3 MHz and 297.2 MHz). The Rx coils were connected to a $^{31}$P/$^1$H interface box plugged to the patient table in the 7T scanner. A $^1$H localization image was acquired (5 ms TE, 20 ms TR, 192×192 matrix size and 8 mm slice thickness) after which spectroscopy data was acquired with a Chemical Shift Imaging (CSI) sequence (0.5 us RF hard pulse, 3 s TR, 16×16 in matrix size, 200 mm×200 mm FOV, 10 average).

Figure 8:
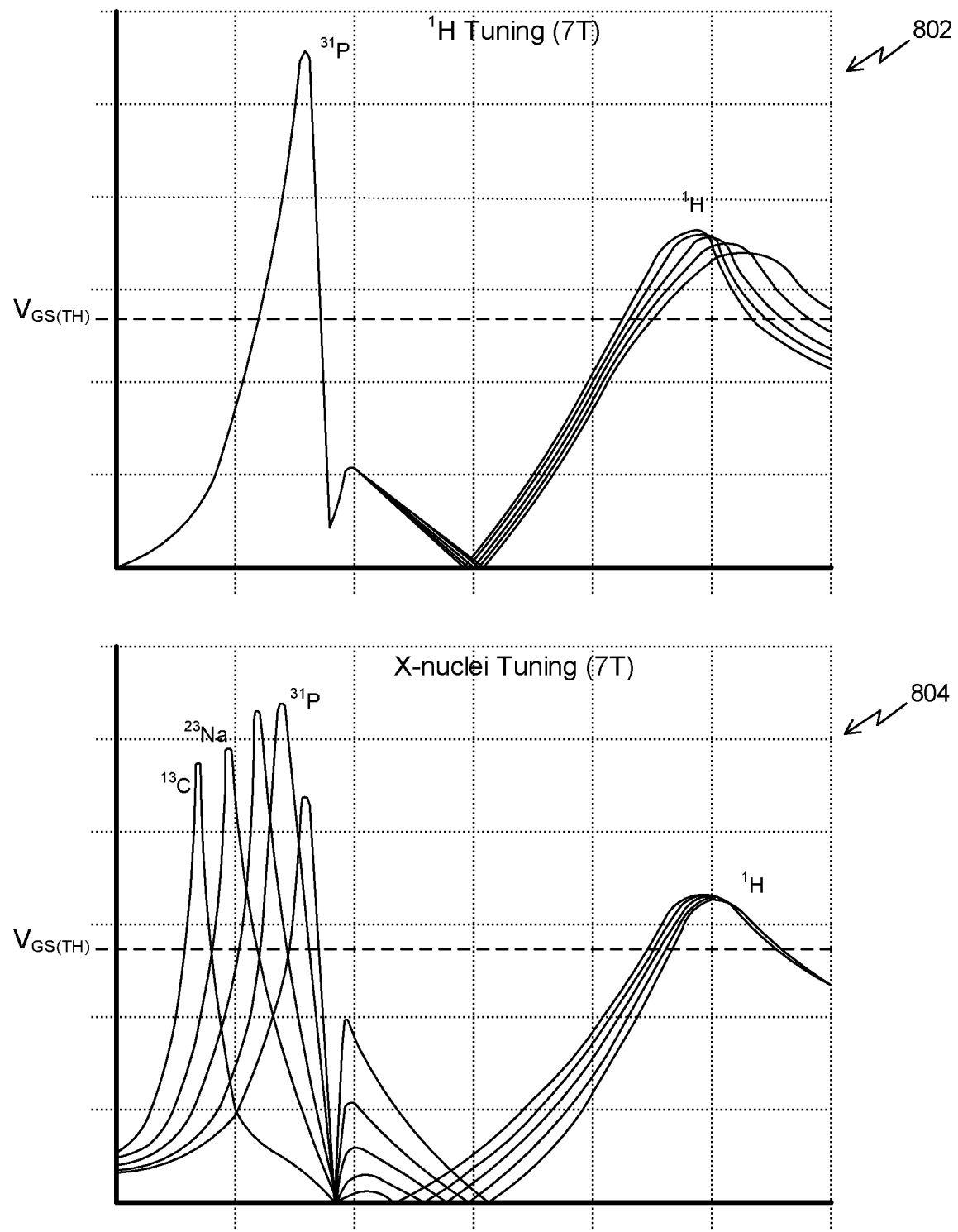
FIG. 8 is a graph of an AC response of a simulated gate voltage of a dual-tuned, optically controlled, on-coil amplifier for a high-field magnetic resonance imaging system, in accordance with one embodiment.
Figure 9:
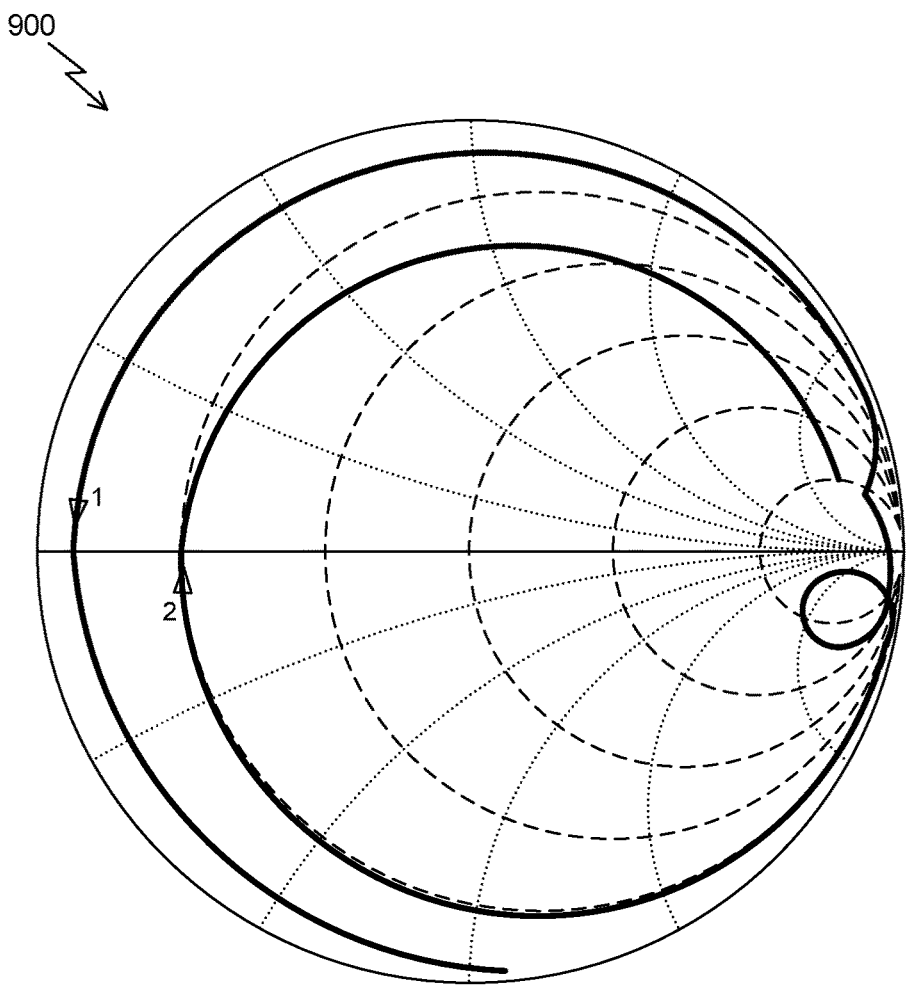
FIG. 9 is a graph of a load impedance at each frequency of dual-tuned, optically controlled, on-coil amplifier for a high-field magnetic resonance imaging system, in accordance with one embodiment.
Figure 10:
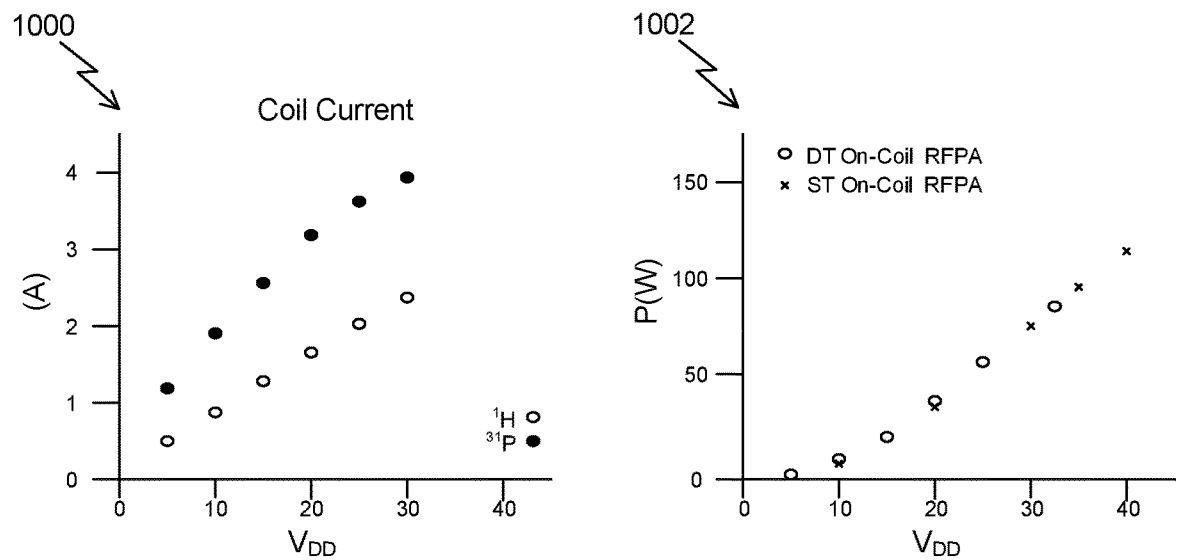
FIG. 10 is a graph of transmit coil current and power delivered for a dual-tuned, optically controlled, on-coil amplifier for a high-field magnetic resonance imaging system, in accordance with one embodiment.

Results of the above-described experiment are illustrated in FIGS. 8-10. In particular, FIG. 8 includes graphs of a simulated frequency response of the gate voltage of a dual-tuned, optically controlled, on-coil amplifier for a high-field magnetic resonance imaging system, in accordance with one embodiment. The frequency response may be obtained by sweeping a single component value of the dual-resonance LC network at a time. More particularly, the graph 802 illustrates the gate voltage at the CMCD stage 520 of the amplifier 500 during tuning of the upper frequency with a single component of the input LC network 518, and the graph 804 illustrates the gate voltage at the CMCD stage 520 of the amplifier 500 during tuning of the lower frequency with a single, but different, component of the LC network 518. As illustrated, tuning of the gate voltage corresponds to the target frequencies for nuclei excitations. FIG. 9 is a graph 900 of a load impedance at each frequency of a dual-tuned, optically controlled, on-coil amplifier for a high-field magnetic resonance imaging system, in accordance with one embodiment. In particular, the graph 900 illustrates the tuning of the dual-tuned (not 50 ohm matched) loop and corresponding load impedance for both of the target frequencies. FIG. 10 is a graph of transmit coil current and power delivered for a dual-tuned, optically controlled, on-coil amplifier for a high-field magnetic resonance imaging system, in accordance with one embodiment. In particular, graph 1000 illustrates transmit coil current for both nuclei and graph 1002 illustrates power delivered to the coil for $^1$H excitation with the dual-tuned amplifier 500. Maximum power delivered to the coil was 46 W and 81 W for $^{31}$P and $^1$H, respectively. Total harmonic distortion (THD) values, estimated from the FFT of the coil current at both frequencies, were THD~1.2% and THD~4.8% for the $^1$H and $^{31}$P current, respectively. No degradation in performance was observed for $^1$H excitation as shown from the power (delivered to the coil) measurement performed with the dual-tuned amplifier 500 compared to a single-tuned design.

Variable Effective Inductor Circuit

As discussed above, the LC networks included in the RFPAs require tuning to select the appropriate frequencies for excitation of one or more nuclei. There are many ways to accomplish the tuning, including swapping out inductors and/or capacitors of the circuit, controlling switches (e.g., transistors, relays, etc.) to select different sets or subsets of inductors and/or capacitors included on a PCB, utilizing variable inductors or capacitors controlled by mechanical or electrical means, and the like. Given that the control for MRI apparatus is typically located in a different room from the MRI apparatus, and that an optical interface is used to control the on-coil RFPAs, an optically-controlled, variable effective inductor circuit is disclosed below that can be controlled using a variable width pulse of a RF optical carrier signal (e.g., a 10 MHz clock signal).

Figure 11A:
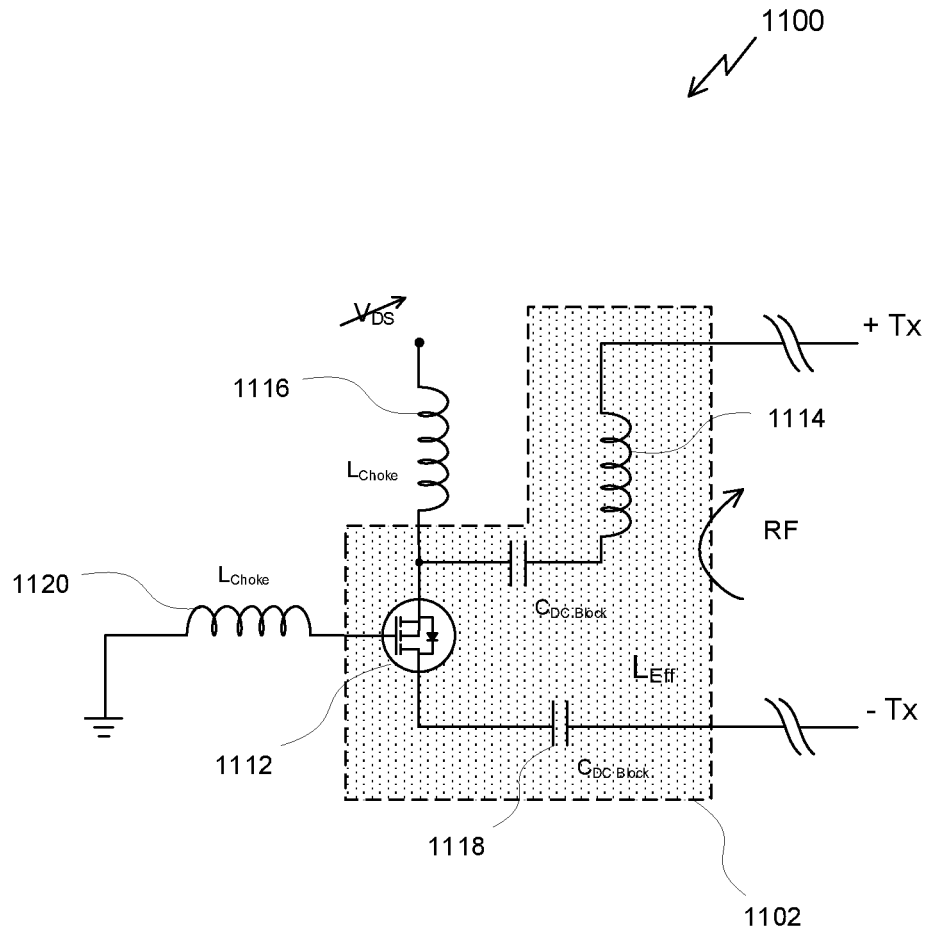
FIG. 11A is a schematic diagram illustrating a variable effective inductor circuit of an LC dual resonance network, in accordance with one embodiment.

FIG. 11A is a schematic diagram illustrating a variable effective inductor circuit 1100 of an LC dual resonance network, in accordance with one embodiment. As discussed above, the dual-tuned, on-coil RFPA 500 as shown in FIG. 5 includes LC networks 508 and 518 that are used for tuning the frequency of the amplified RF signals provided to the dual resonance coils in the MRI apparatus 530. In some embodiments, these LC networks can be manually tuned by varying the effective inductance and/or capacitance in the LC network. In one embodiment, the LC networks 508 and/or 518 can include the depicted variable effective inductor circuit 1100 that is used to adjust the effective inductance of the LC network.

As depicted in FIG. 11A, the variable effective inductor circuit 1100 is formed by connecting the voltage-modulated output port capacitance of an eGaN FET device 1112 in series with a discrete inductor device 1114. The eGaN FET device 1112 and the inductor 1114 are selected based on the desired operating frequencies. In one embodiment, the desired operating frequency range is between approximately 70 MHz and 125 MHz, which cover the Larmor frequencies of nuclei such as $^{13}C$, $^{23}Na$, and $^{31}P$ at 7 T. However, in other embodiments, the characteristics of the eGaN FET device 1112 and the inductor 1114 can be changed to target a different operating frequency range.

The value of the effective inductor (shown as the collection of components in dashed box 1102) is controlled by modulating the eGaN FET drain-source voltage ($V_{DS}$). In an embodiment, VDS can be modulated by changing a duration of a pulsed 10 MHz carrier signal, transmitted via optical fiber, which is discussed in more detail below. The effective inductance of the effective inductor circuit 1102 is given by the following equation:

$$L_{eff} \sim L \frac{\omega^2 LC(V_{DS}) - 1}{\omega^2 LC(V_{DS})}, \quad \text{(Eq. 1)}$$

where L is the inductance of the inductor 1114, C is the output port capacitance ($C_{OSS}$) of the eGaN FET device 1112, $V_{DS}$ is the modulated drain-source voltage of the eGaN FET device 1112, and ω is the frequency of the RF signal connected to the output of the effective inductor 1102.

A choke inductor 1116 may be connected between the modulated drain-source voltage and the drain connector of the eGaN FET device 1112. In addition, DC blocking capacitors 1118 are connected between the source and drain of the eGaN FET device 1112 and the output of the effective inductor 1102. The gate connector of the eGaN FET device is connected to ground via a choke inductor 1120.

Figure 11B:
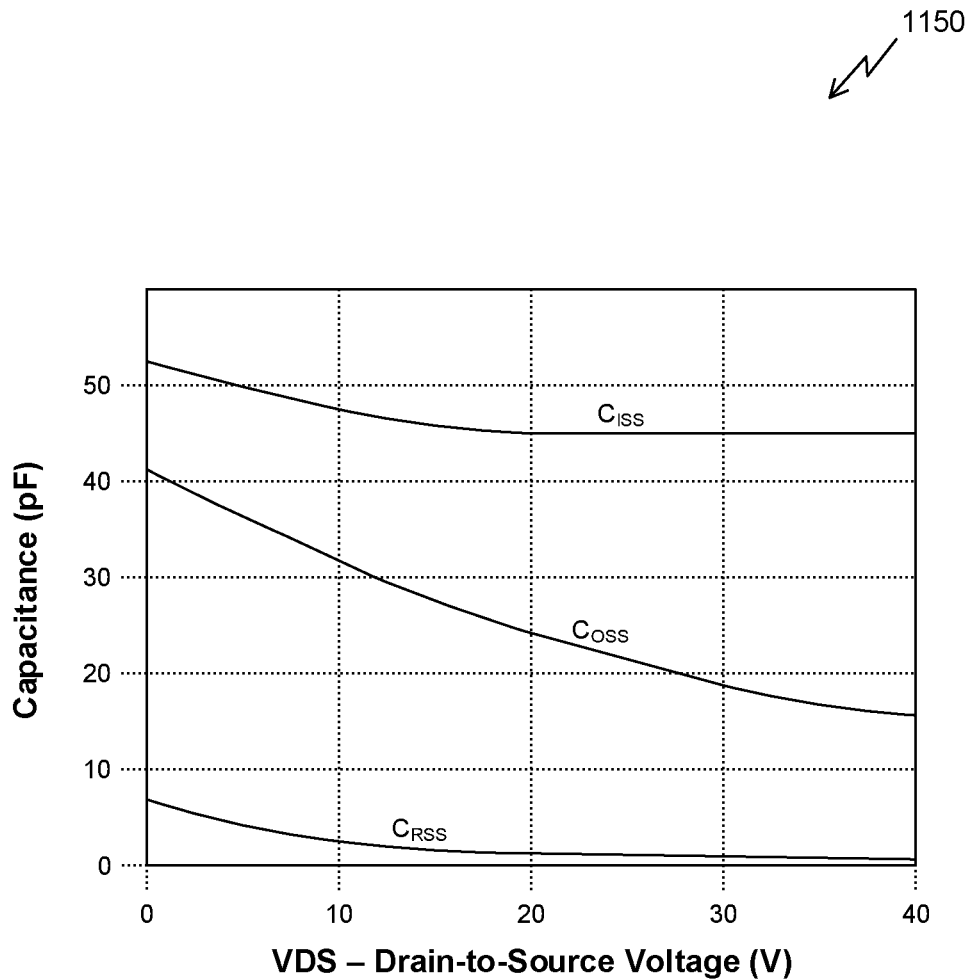
FIG. 11B shows a graph that illustrates the port capacitance for the eGaN FET device as a function of the drain-source voltage ($V_{DS}$).

It will be appreciated that Equation 1 is an approximation that assumes the values of the choke inductor(s) are selected to provide high impedance for the RF signals in a selected bandwidth and the DC blocking capacitance values are selected to provide a low impedance path to the RF signal in the selected bandwidth such that their effect on Equation 1 is minimized. FIG. 11B shows a graph 1150 that illustrates the port capacitance for the eGaN FET device as a function of the drain-source voltage ($V_{DS}$). The eGaN FET device used for one embodiment has a maximum drain-source voltage across the device of 40 V and increasing this voltage from zero volts to the maximum of 40 V reduces the output port capacitance of the device from a maximum of greater than 40 picofarads (pF) to a minimum of approximately 15 pF at 40 V. Thus, by varying the drain-source voltage of the device, the output port capacitance of the eGaN FET device changes, thereby changing the effective inductance of the effective inductor circuit 1102. It will be appreciated that the graph 1150 shows the port capacitances for a single device and that other devices (e.g., other eGaN FET devices) having different maximum operating voltage and different capacitance curves may be selected depending on the application. For example, depending on the MRI field strength and/or the selected X-nuclei frequencies, different eGaN FET devices may be selected to optimize for that particular application. In addition, multiple discrete devices in parallel can be used to increase the effective capacitance to provide an optimal range of effective inductance values where, for example, a single device having the desired characteristics may not be available on the market.

The variable effective inductor circuit 1100 can be incorporated into the RFPA 500 or RFPA 600 as a part of one or more of the LC networks (e.g., LC networks 508 or 518 or Networks 608, 622, or 624). Consequently, a controller, such as controller 308, can be used to control the effective inductance of the variable effective inductor circuit 1100 and, therefore, control the operating frequency of one or more coils of the MRI apparatus.

Figure 12:
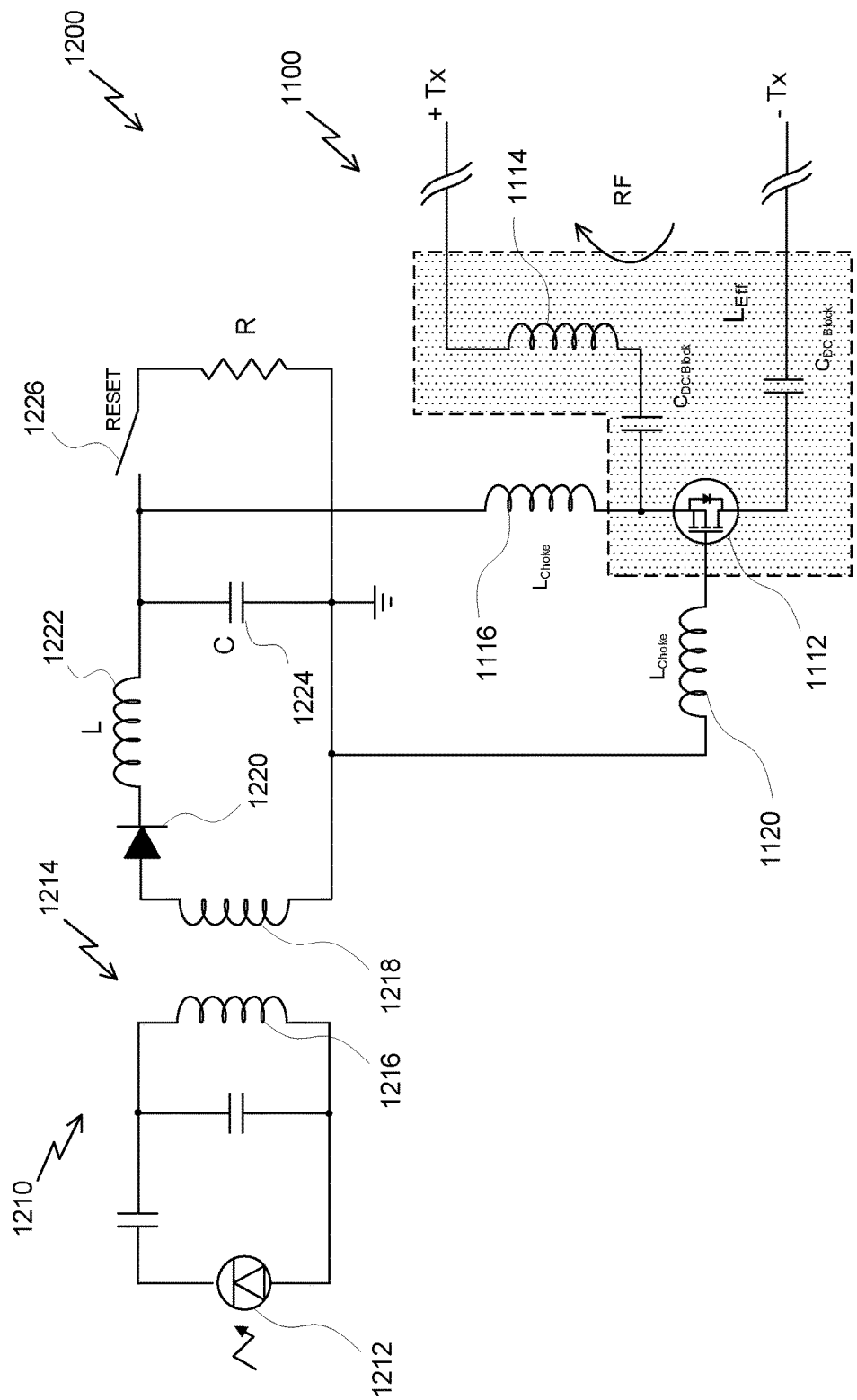
FIG. 12 is a schematic diagram illustrating an optically controller effective inductor circuit, in accordance with one embodiment.

FIG. 12 is a schematic diagram illustrating an optically controlled effective inductor circuit 1200, in accordance with one embodiment. The variable effective inductor circuit 1100 can be controlled by various means for modulating the drain-source voltage across the eGaN FET device 1112. One such application utilizes a 10 MHz clock signal that is accessible in most commercial MRI scanners and can be transmitted through a digital optical link (e.g., an optical fiber).

As depicted in FIG. 12, an optically controlled voltage modulation circuit 1210 includes a fiber optical receiver (FORX) 1212 that converts an optical carrier signal (e.g., an optical tuning signal) to an electrical voltage. The voltage is then amplified by an air core transformer 1214, that includes a primary coil 1216 and a secondary coil 1218. The amplified voltage generated by the secondary coil 1218 is then rectified by a diode 1220 and filtered via an LC circuit including an inductor 1222 and a capacitor 1224. The rectified, filtered voltage is connected to the drain of the eGaN FET device of the variable effective inductor circuit 1100 through the choke inductor 1116. It will be appreciated that the choke inductor 1120 of the variable effective inductor circuit 1100 can be connected to a second terminal of the secondary coil 1218 of the transformer 1214 instead of ground, where the diode is connected to the first terminal of the secondary coil 1218.

The amplitude of the rectified voltage (e.g., $V_{DS}$) is a function of the duration of the pulsed 10 MHz carrier signal. A reset switch 1226, when activated, directs the current through a resistor to discharge the capacitor 1224 and reset the voltage back to 0 V before a next MRI repetition time (TR). The reset switch 1226 is then disabled prior to the next MRI repetition time and receipt of the next carrier signal pulse. It will be appreciated that a 10 MHz clock signal is used due to availability in existing MRI systems, but other frequency carrier signals could be used as well. Using carrier signals of different frequencies can require adjustment of the pulse duration to generate the same rectified voltage compared to the rectified voltage generated based on the 10 MHz carrier signal.

Figure 13:
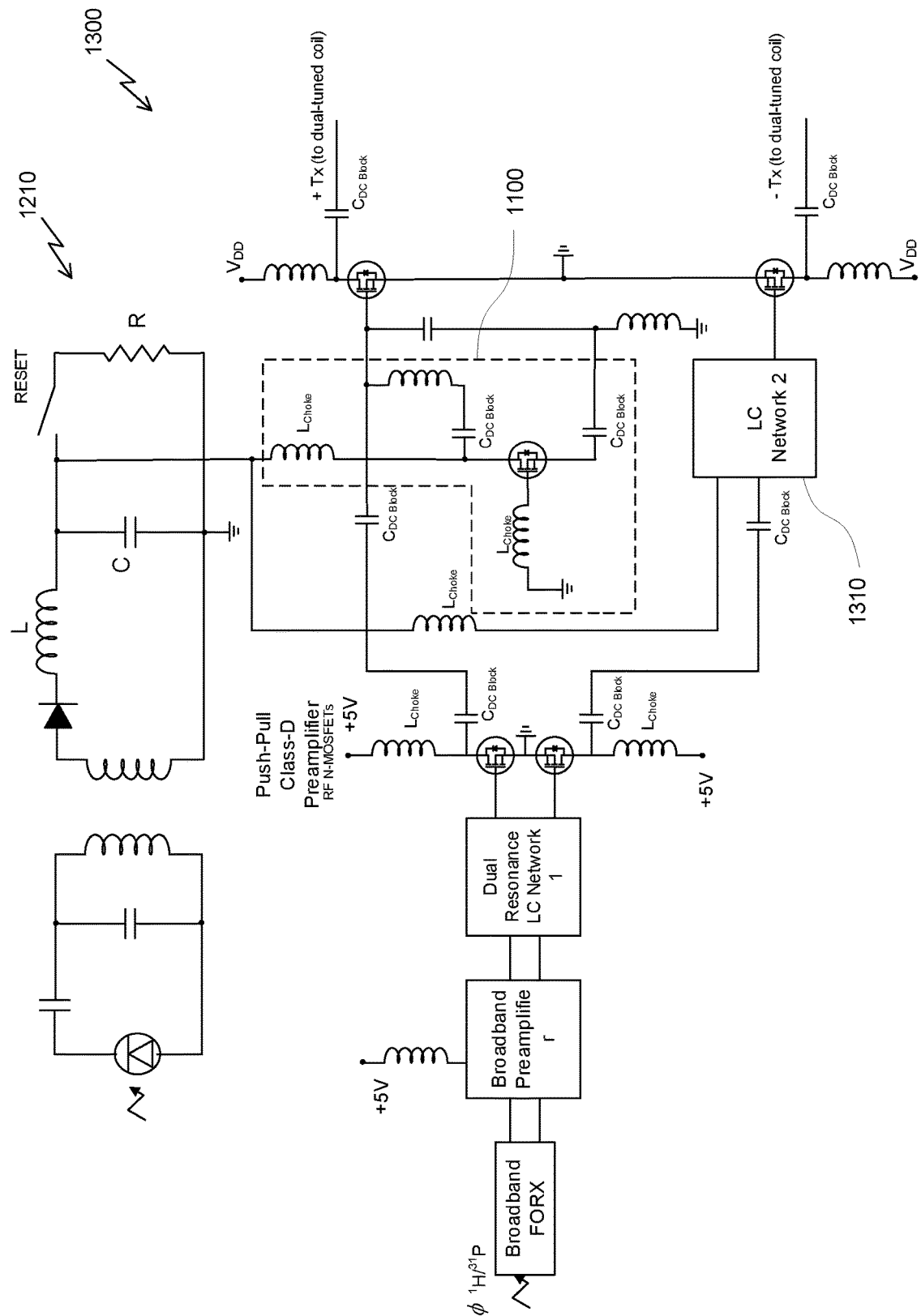
FIG. 13 is a schematic diagram illustrating an adaptable dual-tuned RF power amplifier circuit showing one of the four LC networks implemented with a tunable effective inductor circuit, in accordance with one embodiment.

FIG. 13 is a schematic diagram illustrating an adaptable, dual-tuned RF power amplifier circuit 1300 showing one of the LC networks implemented with a tunable effective inductor circuit 1100, in accordance with one embodiment. As depicted in FIG. 13, the dual-tuned RFPA circuit 1300 is similar to RFPA circuit 500 except that filter 528 and dual resonance coil of the MRI apparatus 530 are not explicitly shown in FIG. 13. In addition, the LC network 518 is shown including a first portion implemented as the variable effective inductor circuit 1100 and a second portion shown as LC network 2 1310. In one embodiment, LC network 2 1310 is implemented using a second variable effective inductor circuit 1100.

The variable effective inductor circuit 1100 and the second LC network 1310 are controlled via a first optically controlled voltage modulation circuit 1210. The drain-source voltage across the eGaN FET device of the variable effective inductor circuit 1100 is modulated based on a variable pulse width of an optical carrier signal (e.g., a 10 MHz RF optical signal). It will be appreciated that the same rectified voltage is supplied to both variable effective inductor circuit 1100 and the second LC network 1310 (which includes a second variable effective inductor circuit 1100).

Figure 14A:
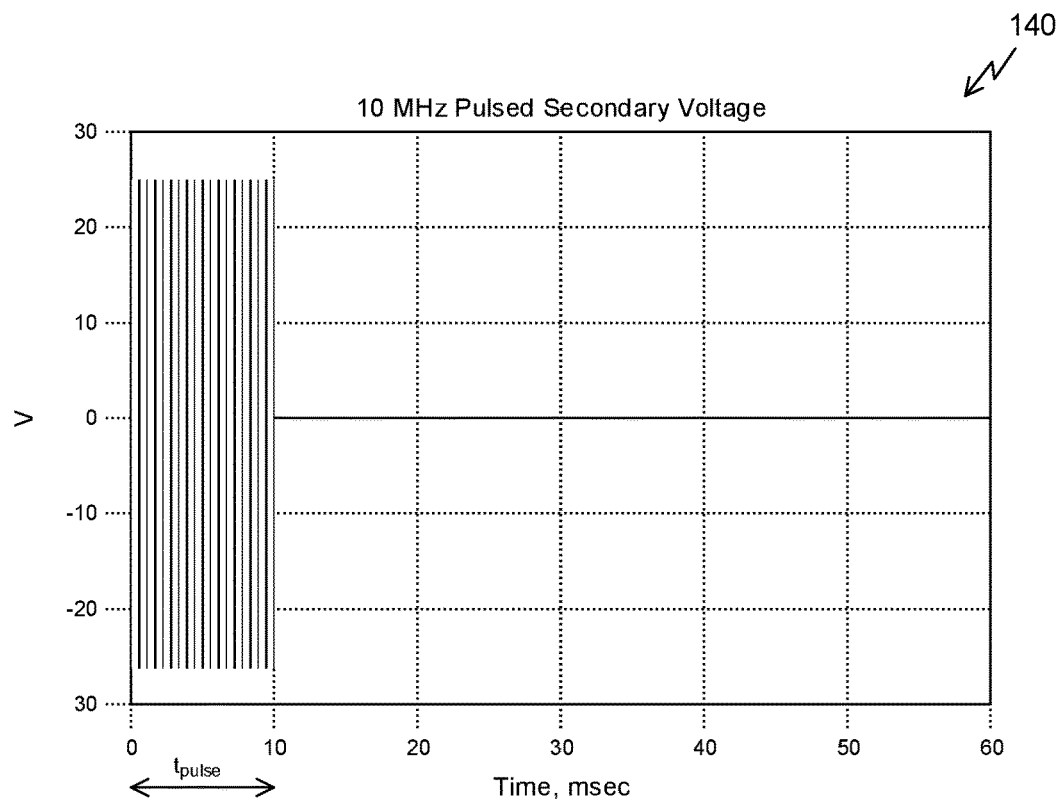
FIG. 14A illustrates a graph showing a voltage at a secondary side of an ideal transformer for a 10 MHz pulse of 10 ms duration, in accordance with one embodiment.

In an embodiment, the RFPA circuit 1300 includes an additional push-pull class-D preamplifier circuit connected to two additional LC networks, each LC network including an instance of the variable effective inductor circuit 1100. This additional branch can be used to tune a second frequency for a second nuclei FIG. 14A illustrates a graph 1402 showing a voltage at a secondary side of an ideal transformer for a 10 MHz pulse of 10 ms duration, in accordance with one embodiment. Again, a RF carrier signal (e.g., 10 MHz signal) is received by the optically controlled voltage modulation circuit 1210 at an optical receiver, which converts the optical signal to an electrical signal connected to a primary coil of a transformer 1214. In an embodiment, the transformer 1214 has a winding ratio of 0.2, resulting in a step up transformer that increases the voltage applied to the primary coil 1216 five-fold at the secondary coil 1218.

It will be appreciated that the graph 1402 shows a peak to peak voltage of approximately 50 Volts (+25 V to −25 V) of a 10 MHz signal for the time between 0 and 10 milliseconds (i.e., the pulse width or pulse duration). Although the graph is illustrated with a number of vertical lines in this portion of the graph, the actual trace of the voltage signal is much more compact as there are 100,000 cycles in the signal over the course of 10 ms. After the pulse duration (e.g., after 10 ms), the voltage on the secondary coil of the ideal transformer is reduced to zero.

Figure 14B:
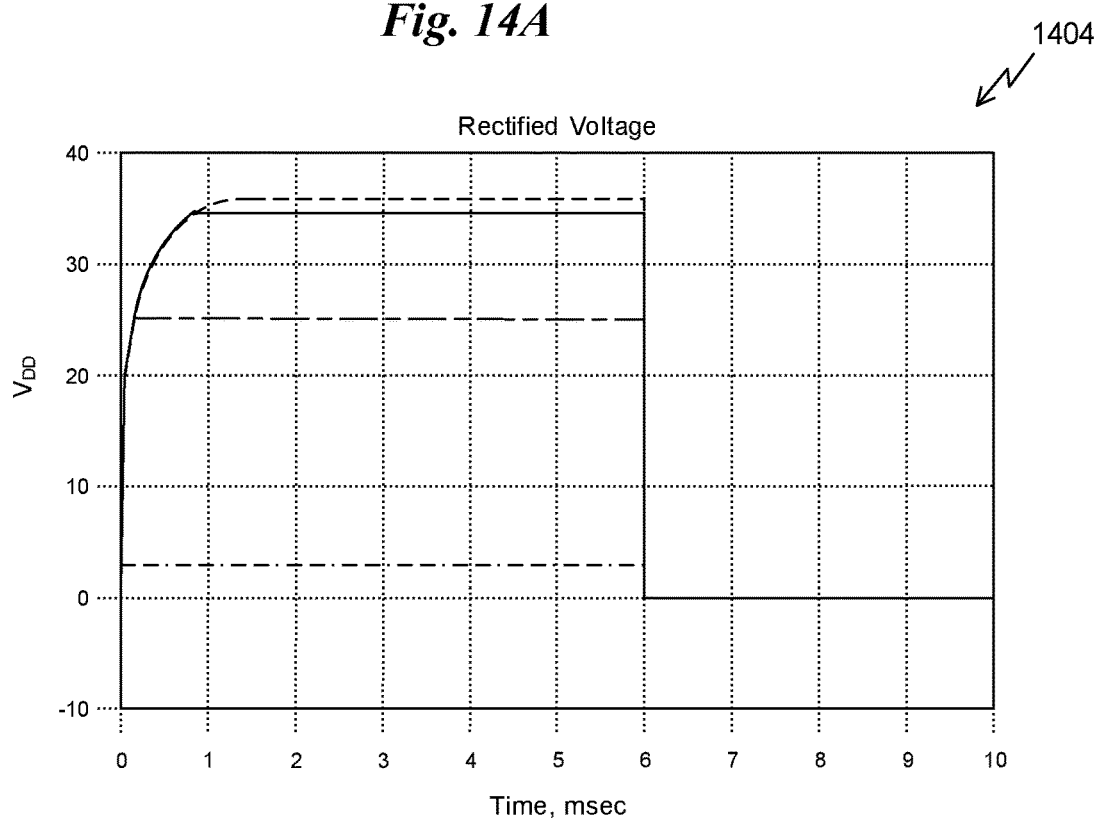
FIG. 14B illustrates a graph showing a rectified voltage associated with different pulse durations, in accordance with one embodiment.

FIG. 14B illustrates a graph 1404 showing a rectified voltage associated with different pulse durations, in accordance with one embodiment. As depicted in FIG. 14B, a pulse width of 5 ms results in a rectified voltage having a maximum of approximately 36 V; a pulse width of 1 ms results in a rectified voltage having a maximum of approximately 34 V; a pulse width of 0.1 ms results in a rectified voltage having a maximum of approximately 25 V; and a pulse width of 0.01 ms results in a rectified voltage having a maximum of approximately 4 V. It will be appreciated that the rectified voltages shown in FIG. 14B are shown for illustration only and that different pulse widths, a different frequency carrier signal, and different components in the rectification circuit may result in different curve shapes and/or maximum voltages.

It will be appreciated that the optically controlled effective inductor circuit 1200 is disclosed for use in an MRI apparatus or system. However, the optically controlled effective inductor circuit 1200 can be utilized in any circuit or apparatus that requires a variable inductance device controlled via an optical RF carrier signal. Other example uses of the disclosed circuit include telecommunications equipment or any other application where tuning an LC network is desired.

Figure 15:
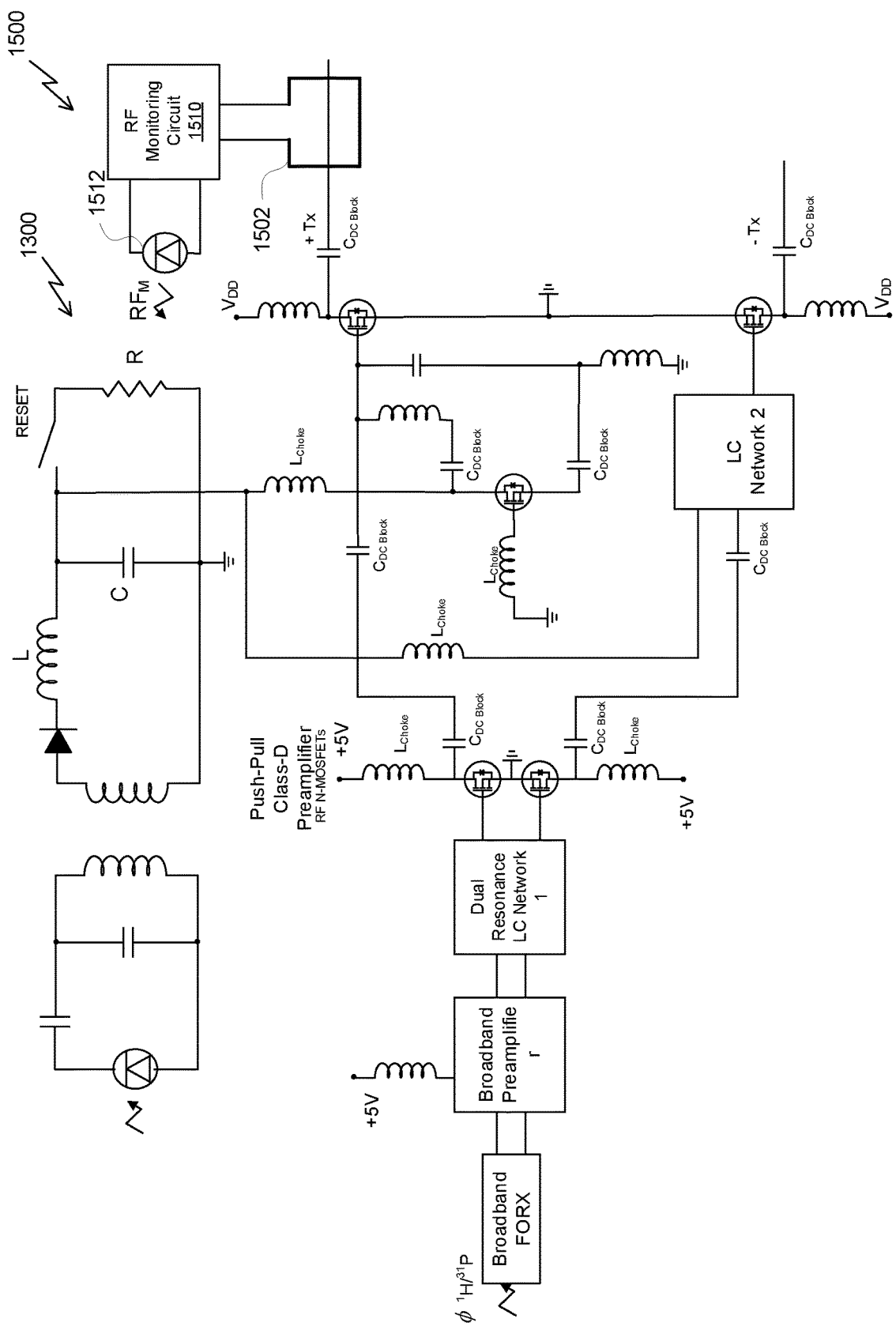
FIG. 15 illustrates an adaptable dual-tuned RF power amplifier circuit with RF sensing, in accordance with one embodiment.

FIG. 15 illustrates an adaptable dual-tuned RF power amplifier circuit 1500 with RF sensing, in accordance with one embodiment. The RFPA 1500 is similar to the RFPA 1300 shown in FIG. 13. In addition, the RFPA 1500 includes a loop sensor 1502 that surrounds the output wire providing the RF signal to the transmit coil. A current in the output wire induces a current on the loop sensor 1502, which is monitored by an RF monitoring circuit 1510.

In an embodiment, the RF monitoring circuit 1510 is connected to an optical transmitter 1512 that generates an RF feedback signal ($RF_M$) that is transmitted back to the control system to allow a controller to automatically tune the variable effective inductor circuit 1100 to adjust the frequency of the RF signal transmitted to the transmit coil. In some embodiments, the RF monitoring circuit 1510 measures the frequency of the RF signal induced in the loop sensor 1502 and encodes the measured frequency in the optical signal. In one embodiment, the RF monitoring circuit 1502 down converts the RF signal, for example, by mixing the RF signal with a reference oscillator signal, to be digitally converted and optically transmitted back to the controller. The controller then extracts the frequency information from the down converted signal.

Figure 16:
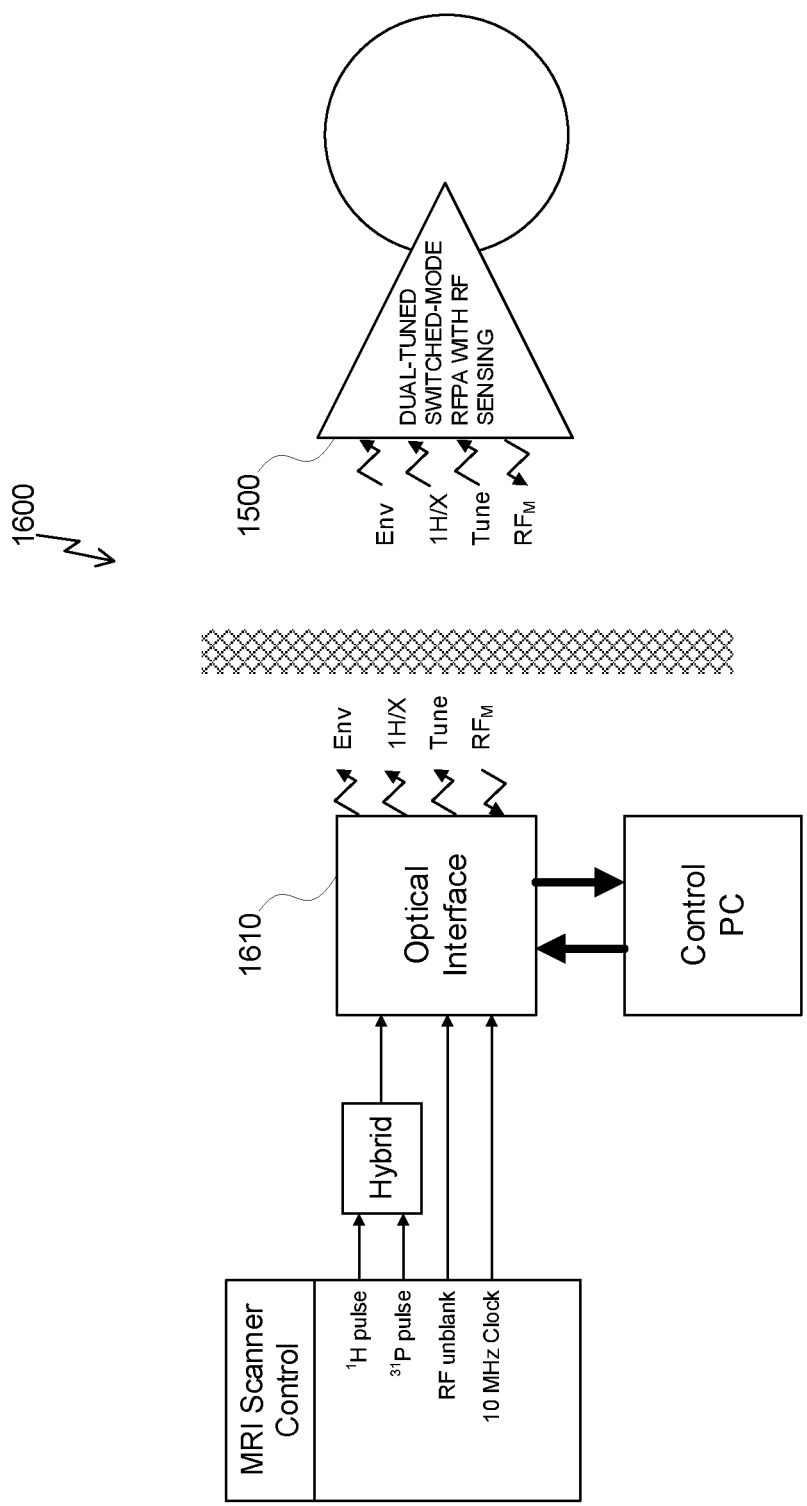
FIG. 16 is a schematic diagram illustrating a control system for an optically controlled, multi-transmitter magnetic resonance imaging system, in accordance with one embodiment.

FIG. 16 is a schematic diagram illustrating a control system 1600 for an optically controlled, multi-transmitter magnetic resonance imaging system, in accordance with one embodiment. The control system 1600 is similar to control system 400 of FIG. 4. However, in addition to the multi-frequency RF pulse signal generated by the controller 408, the optical interface 410 also transmits an envelope signal and a tune signal to the RFPA 1500. The envelope and/or the tune signals are used to adjust the LC networks of the RFPA 1500 as described above.

The optical interface 1610 also receives the RF feedback signal ($RF_M$) from the RFPA 1500, which can be used by the controller 408 and/or computing system 409 to adjust the tune signal (e.g., the pulse duration of the tune signal) to change the effective inductance in one or more of the LC networks. It will be appreciated that the diagram shown in FIG. 16 illustrates only one monitoring circuit associated with one transmit coil, but that multiple monitoring circuits corresponding to multiple transmit coils and/or two monitoring circuits for a single dual resonance transmit coil may be utilized in the RFPA 1500 and that the control system 1600 may receive separate RF feedback signals for each monitoring circuit.

Figure 17:
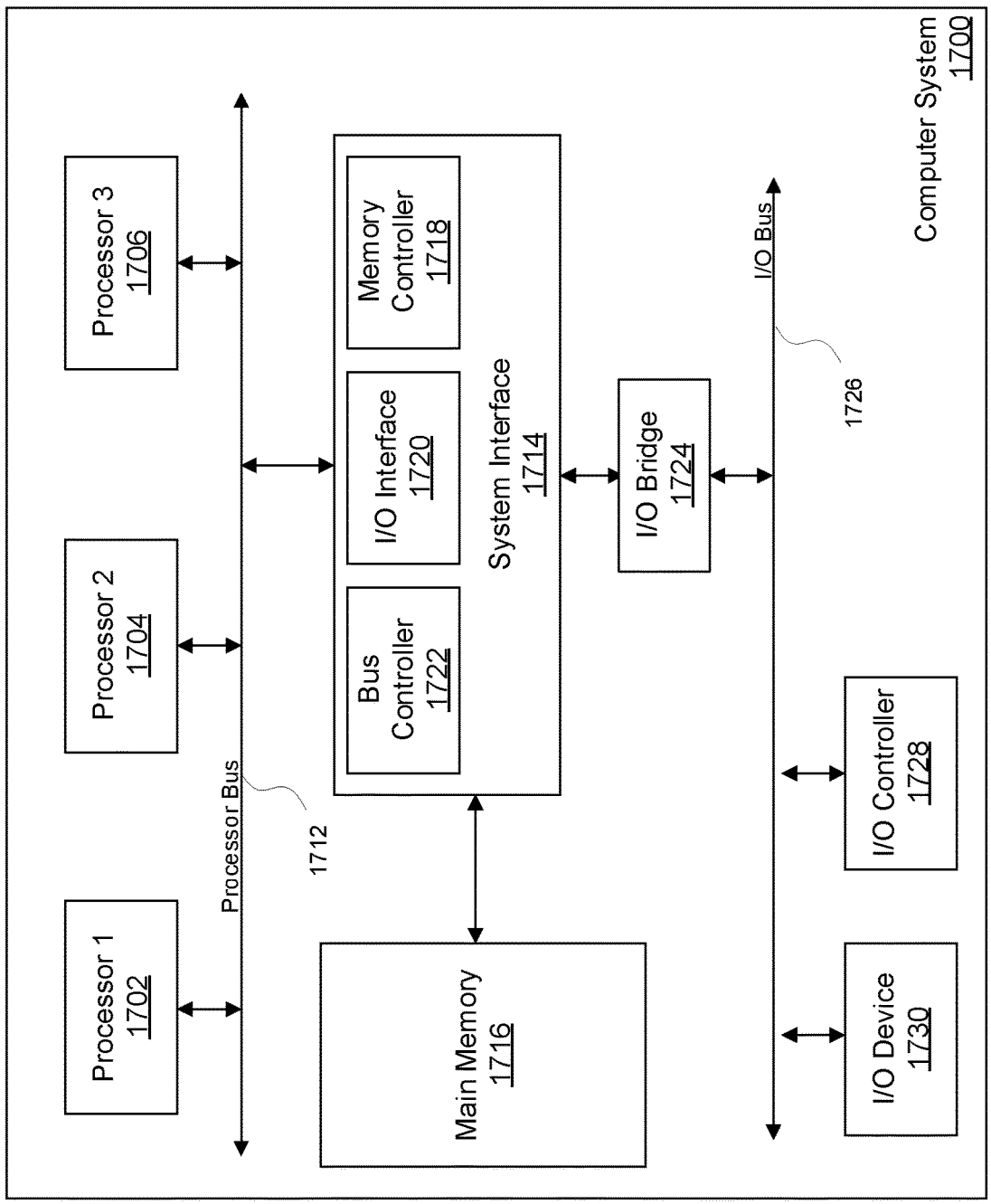
FIG. 17 is a diagram illustrating an example of a computing system which may be used in implementing embodiments of the present disclosure.

FIG. 17 is a block diagram illustrating an example of a computing device or computer system 1700 which may be used in implementing the embodiments of the components of the network disclosed above. For example, the computing system 1700 of FIG. 17 may be the controller 308 discussed above. The computer system 1700 includes one or more processors 1702-1706. Processors 1702-1706 may include one or more internal levels of cache (not shown) and a bus controller or bus interface unit to direct interaction with the processor bus 1712. Processor bus 1712, also known as the host bus or the front side bus, may be used to couple the processors 1702-1706 with the system interface 1714. System interface 1714 may be connected to the processor bus 1712 to interface other components of the system 1700 with the processor bus 1712. For example, system interface 1714 may include a memory controller 1718 for interfacing a main memory 1716 with the processor bus 1712. The main memory 1716 typically includes one or more memory cards and a control circuit (not shown). System interface 1714 may also include an input/output (I/O) interface 1720 to interface one or more I/O bridges or I/O devices with the processor bus 1712. One or more I/O controllers and/or I/O devices may be connected with the I/O bus 1526, such as I/O controller 1728 and I/O device 1730, as illustrated.

I/O device 1730 may also include an input device (not shown), such as an alphanumeric input device, including alphanumeric and other keys for communicating information and/or command selections to the processors 1702-1706. Another type of user input device includes cursor control, such as a mouse, a trackball, or cursor direction keys for communicating direction information and command selections to the processors 1702-1706 and for controlling cursor movement on the display device.

System 1700 may include a dynamic storage device, referred to as main memory 1716, or a random access memory (RAM) or other computer-readable devices coupled to the processor bus 1712 via system interface 1714 for storing information and instructions to be executed by the processors 1702-1706. Main memory 1716 also may be used for storing temporary variables or other intermediate information during execution of instructions by the processors 1702-1706. System 1700 may include a read only memory (ROM) and/or other static storage device coupled to the processor bus 1712 via system interface 1714 for storing static information and instructions for the processors 1702-1706. The system set forth in FIG. 17 is but one possible example of a computer system that may employ or be configured in accordance with aspects of the present disclosure.

According to one embodiment, the above techniques may be performed by computer system 1700 in response to processor 1704 executing one or more sequences of one or more instructions contained in main memory 1716. These instructions may be read into main memory 1716 from another machine-readable medium, such as a storage device. Execution of the sequences of instructions contained in main memory 1716 may cause processors 1702-1706 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 1716. Common forms of machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

What is claimed is:

1. An amplifier for a magnetic resonance imaging system, the amplifier comprising:
a broadband interface circuit comprising a broadband preamplifier circuit, a first dual resonance tuning circuit, and a push-pull preamplifier, wherein the broadband interface circuit is configured to process an optical carrier signal to generate an output radio frequency (RF) signal at a first frequency to create a first nuclear magnetic resonance in a material receiving an RF signal at the first frequency; and
a dual-tuned amplification circuit comprising a second dual resonance tuning circuit in electrical communication with a current-mode amplifier, wherein the dual-tuned amplification circuit is configured to amplify the output RF signal to an amplified RF signal,
wherein the dual-tuned amplification circuit is configured to be engaged to at least one imaging coil of the magnetic resonance imaging system configured to receive the amplified RF signal.

2. The amplifier of claim 1, wherein the optical carrier signal comprises a frequency from 50 megahertz to 800 megahertz,
wherein an output of the broadband preamplifier circuit is connected to an input of the first dual resonance tuning circuit
wherein an input of the first dual resonance tuning circuit is connected an input of the push-pull preamplifier, and
wherein the broadband interface is configured to electrically connect with an optical receiver, which is configured to receive the optical carrier signal.

3. The amplifier of claim 1, wherein the first dual resonance tuning circuit comprises a first inductor-capacitor (LC) circuit, wherein an inductor of the first LC circuit is controllable to tune the first dual resonance tuning circuit to the first frequency.

4. The amplifier of claim 3, wherein the second dual resonance tuning circuit comprises a second inductor-capacitor (LC) circuit, wherein an inductor of the second LC circuit is controllable to tune the second dual resonance tuning circuit to the first frequency.

5. The amplifier of claim 1, wherein the current-mode amplifier comprises an on-coil, current-mode class D (CMCD) amplifier to drive the at least one imaging coil of the magnetic resonance imaging system.

6. The amplifier of claim 1, wherein the broadband interface circuit is configured to process the optical carrier signal to generate a second output RF signal at a second frequency different than the first frequency to create a second nuclear magnetic resonance in a material sensitive to an RF signal at the second frequency.

7. The amplifier of claim 1, wherein the push-pull preamplifier comprises:
a first field effect transistor (FET) controlled by a first output signal of the first dual resonance tuning circuit; and
a second FET controlled by a second output signal of the first dual resonance tuning circuit in a push pull configuration.

8. The amplifier of claim 1, wherein the at least one imaging coil of the magnetic resonance imaging system comprises a dual-resonance coil.

9. The amplifier of claim 1, wherein the at least one imaging coil of the magnetic resonance imaging system comprises a plurality of nested single-resonance coils.

10. The amplifier of claim 1 further comprising:
a dual-tuned filter in electrical communication between the dual-tuned amplification circuit and the at least one imaging coil.

11. The amplifier of claim 1, wherein the dual-tuned amplification circuit comprises a plurality of single-frequency resonance tuning circuits each electrically connected to a corresponding current-mode amplifier circuit.

12. The amplifier of claim 1, wherein at least one of the first dual resonance tuning circuit or the second dual resonance tuning circuit comprises:

a gallium nitride (eGaN) field effect transistor (FET) device; and an inductor, wherein a drain connector of the eGaN FET device is connected to a first end of the inductor, and wherein the output RF signal is connected between a second end of the inductor and a source connector of the eGaN FET device.

13. The amplifier of claim 12, wherein the drain connector of the eGaN FET device is connected to an optically controlled voltage modulation circuit that generates a rectified voltage in accordance with a pulse duration of an optical tuning signal.

14. The amplifier of claim 13, wherein the optical tuning signal has a frequency between 1 MHz and 20 MHz.

15. A magnetic resonance imaging system, comprising:
a plurality of coils comprising at least one transmit coil and at least one receive coil;
a controller coupled to an optical interface comprising one or more optical transmitters; and
at least one radio frequency power amplifier (RFPA) circuit, each RFPA circuit engaged to a corresponding transmit coil, the RFPA circuit comprising:
a broadband interface circuit comprising a broadband preamplifier circuit, a first dual resonance tuning circuit, and a push-pull preamplifier, wherein the broadband interface circuit is configured to process an optical carrier signal generated by a first optical transmitter of the optical interface to generate an output radio frequency (RF) signal at a first frequency to create a first nuclear magnetic resonance in a material receiving an RF signal at the first frequency, and
a dual-tuned amplification circuit comprising a second dual resonance tuning circuit in electrical communication with a current-mode amplifier, wherein the dual-tuned amplification circuit is configured to amplify the output RF signal to an amplified RF signal,
wherein the dual-tuned amplification circuit is engaged to the corresponding transmit coil.

16. The magnetic resonance imaging system of claim 15, wherein the at least one transmit coil comprises a dual-resonance coil.

17. The magnetic resonance imaging system of claim 15, wherein the at least one transmit coil comprises a plurality of nested single-resonance coils.

18. The magnetic resonance imaging system of claim 15, wherein the controller comprises:
at least one processor; and
a memory storing instructions that, responsive to being executed by the processor, cause the processor to control the one or more optical transmitters to generate optical signals transmitted to the at least one RFPA circuit via at least one optical cable.

19. The magnetic resonance imaging system of claim 15, wherein the RFPA circuit further comprises a loop sensor, a RF monitoring circuit, and an optical transmitter configured to transmit an optical feedback signal to the controller.

20. The magnetic resonance imaging system of claim 15, wherein at least one of the first dual resonance tuning circuit or the second dual resonance tuning circuit comprises:
a gallium nitride (eGaN) field effect transistor (FET) device; and
an inductor,
wherein:
a drain connector of the eGaN FET device is connected to a first end of the inductor,
the output RF signal is connected between a second end of the inductor and a source connector of the eGaN FET device, and
the drain connector of the eGaN FET device is connected to an optically controlled voltage modulation circuit that generates a rectified voltage in accordance with a pulse duration of an optical tuning signal.

\* \* \* \* \*